(12) United States Patent
Kobayashi et al.

(10) Patent No.: US 7,888,984 B2
(45) Date of Patent: Feb. 15, 2011

(54) INTERMITTENT OPERATION CIRCUIT AND MODULATION DEVICE

(75) Inventors: Shigeru Kobayashi, Tokyo (JP); Suguru Fujita, Tokyo (JP)

(73) Assignee: Panasonic Corporation, Osaka (JP)

( * ) Notice: Subject to any disclaimer, the term of this patent is extended or adjusted under 35 U.S.C. 154(b) by 402 days.

(21) Appl. No.: 12/064,446

(22) PCT Filed: Aug. 23, 2006

(86) PCT No.: PCT/JP2006/316522
§ 371 (c)(1),
(2), (4) Date: Feb. 21, 2008

(87) PCT Pub. No.: WO2007/023866
PCT Pub. Date: Mar. 1, 2007

(65) Prior Publication Data
US 2009/0128247 A1   May 21, 2009

(30) Foreign Application Priority Data

Aug. 23, 2005 (JP) ............................... 2005-240641
Aug. 23, 2006 (JP) ............................... 2006-226283

(51) Int. Cl.
*H03K 3/00* (2006.01)

(52) U.S. Cl. .......................... 327/291; 331/14; 331/16; 331/34; 331/74; 331/158; 331/116 R; 331/116 FE; 331/177 R; 332/149

(58) Field of Classification Search ................. 327/291; 331/14, 16, 34, 74, 158, 116 R, 116 FE, 177 R; 332/149
See application file for complete search history.

(56) References Cited

U.S. PATENT DOCUMENTS

| 5,313,198 | A * | 5/1994 | Hirao et al. ............... 340/10.51 |
| 6,223,024 | B1 * | 4/2001 | Fujii ........................ 455/343.5 |
| 6,259,390 | B1 * | 7/2001 | Joe ............................. 341/133 |
| 2001/0017574 | A1 * | 8/2001 | Oka ....................... 331/116 R |
| 2003/0006925 | A1 | 1/2003 | Joe |
| 2003/0098733 | A1 * | 5/2003 | Saita .......................... 327/291 |

FOREIGN PATENT DOCUMENTS

| JP | 2-134923 | 5/1990 |
| JP | 03-231504 | 10/1991 |
| JP | 7-030386 | 1/1995 |
| WO | 01/31784 | 5/2001 |

OTHER PUBLICATIONS

International Search Report dated Nov. 21, 2006.

* cited by examiner

*Primary Examiner*—Arnold Kinkead
*Assistant Examiner*—Richard Tan
(74) *Attorney, Agent, or Firm*—Dickinson Wright PLLC

(57) ABSTRACT

There is provided a small-size, low-power-consumption intermittent operation circuit capable of obtaining an output waveform having a rapid rise and fall. The intermittent operation circuit includes an active circuit (106), a first control signal generation circuit (101) for generating a first control signal (S1) for controlling the operation start and the operation end of the active circuit (106), a second control signal generation circuit (102) for generating a second control signal (S2) causing the active circuit (106) to perform ringing vibration and controlling the frequency and the amplitude value of the ringing vibration, and a timing adjusting circuit (103) for adjusting the input timing of the first and the second control signal (S1, S2) into the active circuit (106) so that the ringing vibration and the safety vibration are outputted continuously from the active circuit (106).

13 Claims, 27 Drawing Sheets

(a) RINGING OSCILLATION (b) STABLE OSCILLATION (c) RAPID-RISE OSCILLATION

INTERMITTENT OPERATION CIRCUIT AND MODULATION DEVICE

TECHNICAL FIELD

The present invention relates to an intermittent operation circuit, and more particularly to an intermittent operation circuit that operates an oscillator, amplifier, or frequency multiplier intermittently, and whose transient state until a steady state is reached after the start of intermittent operation (rise), and transient state until the end of intermittent operation is reached after a steady state (fall), are extremely short. Also, the present invention relates to a modulator equipped with such an intermittent operation circuit.

BACKGROUND ART

Heretofore, the development of communications and radar using short-pulse signals has been carried out as one UWB (Ultra Wide Band) technology. Methods of making a short-pulse signal having only a desired frequency band component are to extract only a specific frequency component by performing frequency band limiting of a pulse signal by means of a filter, or to obtain short pulses by intermittent operation of an oscillator by inputting a pulsed control signal. There is also a method whereby intermittent circuit operation is performed by inputting a pulsed control signal to an amplifier or frequency multiplier, and a short pulse is generated that corresponds to an interval in which the voltage level of the control signal is high.

An oscillator is composed of an active element such as a transistor, a negative resistor comprising a tunnel diode or operational amplifier, and a resonant circuit. A conventional intermittent operation circuit using a tunnel diode oscillator will be described using FIG. 1. In intermittent operation circuit 10, a control signal output from a control signal generation circuit 11 is input to a negative resistor 13 via an inductor 12. Negative resistor 13 has the kind of voltage-current characteristic indicated by reference code 14 in FIG. 1, with oscillation performed when the voltage of the input control signal is located in area 1, and oscillation stopping when the voltage of the input control signal is located in area 2 or area 3 (see Patent Document 1).

However, with the above-described conventional circuit configuration, when a pulsed control signal is input to the circuit, the control signal waveform is rounded due to floating capacitance or parasitic capacitance present in the circuit. Consequently, there is a period of time until a steady state is reached after the control signal is input (rise time), and a period of time until oscillation stops after the control signal is stopped (fall time), as a result of which the rise and fall of the output waveform is rounded. This problem is not limited to a case in which a tunnel diode is used as a negative resistor, but also occurs in a similar way in an oscillator that uses a transistor. Furthermore, this problem is not limited to an oscillator, and the same kind of problem also occurs in intermittent operation of an amplifier or frequency multiplier.

Heretofore, one known method of solving this problem, as shown in FIG. 2, has been to use a waveform 21 in which overshoot 22 and undershoot 23 are caused in the rise and fall areas as a control signal. By means of overshoot 22 and undershoot 23, waveform rounding due to input capacitance (inter-terminal capacitance or floating capacitance) present in an oscillator, amplifier, or frequency multiplier can be canceled, enabling the rise time and fall time of the output waveform to be effectively shortened.

However, with this method, the output waveform does not rise at high speed at or above the gradient of the control signal, and ideal waveform shaping is difficult. The use of a speed-up capacitor to generate overshoot and undershoot is known as a means of performing waveform shaping easily, but since a self-resonant frequency is present in a capacitor, there are limits on the frequency components of generated overshoot and undershoot, and consequently the control signal does not have a sufficiently steep waveform. Therefore, although the waveform has a smooth rise and fall, as shown by waveform 31 in FIG. 3, and there is an input capacitance charging effect, a nanosecond-order rise characteristic is not obtained. In the case of an intermittent operation circuit, in particular, it is difficult to generate short pulses that can be used in UWB because of delay in the feedback circuit of the circuit.

A method of solving this problem, as shown in FIG. 4, is to input a short-time-width startup boosting signal having the same frequency components as an oscillator 43 that includes a crystal resonator 42, generated by a standard signal generation apparatus 41, to oscillator 43 based on a timing waveform from a timing generation circuit 44 (see Patent Document 2). This enables the growth of oscillation to be boosted at the time of an output waveform rise, and is therefore effective in achieving high-speed oscillation startup.

Patent Document 1: National Publication of International Patent Application No. 2003-513501

Patent Document 2: Unexamined Japanese Patent Publication No. HEI 3-231504

DISCLOSURE OF INVENTION

Problems to be Solved by the Invention

However, with the circuit configuration described in above Patent Document 2, a separate external active circuit (standard signal generation apparatus 41) for generating a short-pulse signal is necessary, making two or more active circuits necessary, with resultant problems of increased circuit scale and power consumption.

It is an object of the present invention to provide an intermittent operation circuit and modulator that enable an output waveform having a rapid rise and fall to be obtained with a small circuit scale and low power consumption.

Means for Solving the Problems

An intermittent operation circuit of the present invention employs a configuration that includes an active circuit having an active element, a first control signal generation circuit that generates a first control signal that controls operation starting and operation stopping of the active circuit, a second control signal generation circuit that generates a second control signal that causes the active circuit to perform ringing oscillation and can control the frequency and amplitude value of that ringing oscillation, and a timing adjustment circuit that adjusts the input timing of the first and second control signals to the active circuit so that ringing oscillation and stable oscillation are output continuatively from the active circuit.

By this means, time blanks at the time of stable oscillation rise and fall can be filled by ringing oscillation generated in the active circuit by the second control signal, and as a result, an intermittent operation circuit with an output waveform having a rapid rise and fall can be implemented.

A modulator of the present invention employs a configuration that includes an above-described intermittent operation circuit, and a transmit signal supply section that inputs a transmit signal comprising transmit data to the first and second control signal generation circuits of this intermittent operation circuit, wherein the intermittent operation circuit changes at least one of the absolute value of the voltage value of the first control signal and the absolute value of the voltage value of the second control signal or the gradient of the rise of the second control signal based on the transmit signal, and outputs a modulated signal resulting from modulation of the transmit signal.

By this means, a modulator can be implemented that enables a short-pulse (modulated signal) having a fast output waveform rise time and fall time to be obtained, and that makes it possible to change the amplitude and frequency of that ringing oscillation arbitrarily according to a transmit signal. As a result, a modulator can be implemented that is suitable for application to high-speed communications, high-resolution radar, and the like.

ADVANTAGEOUS EFFECT OF THE INVENTION

According to the present invention, an intermittent operation circuit and modulator that enable an output waveform having a rapid rise and fall to be obtained can be implemented with a small circuit scale and low power consumption.

BEST MODE FOR CARRYING OUT THE INVENTION

Embodiments of the present invention will now be described in detail with reference to the accompanying drawings.

Embodiment 1

(1) Overall Configuration

Figure 1:
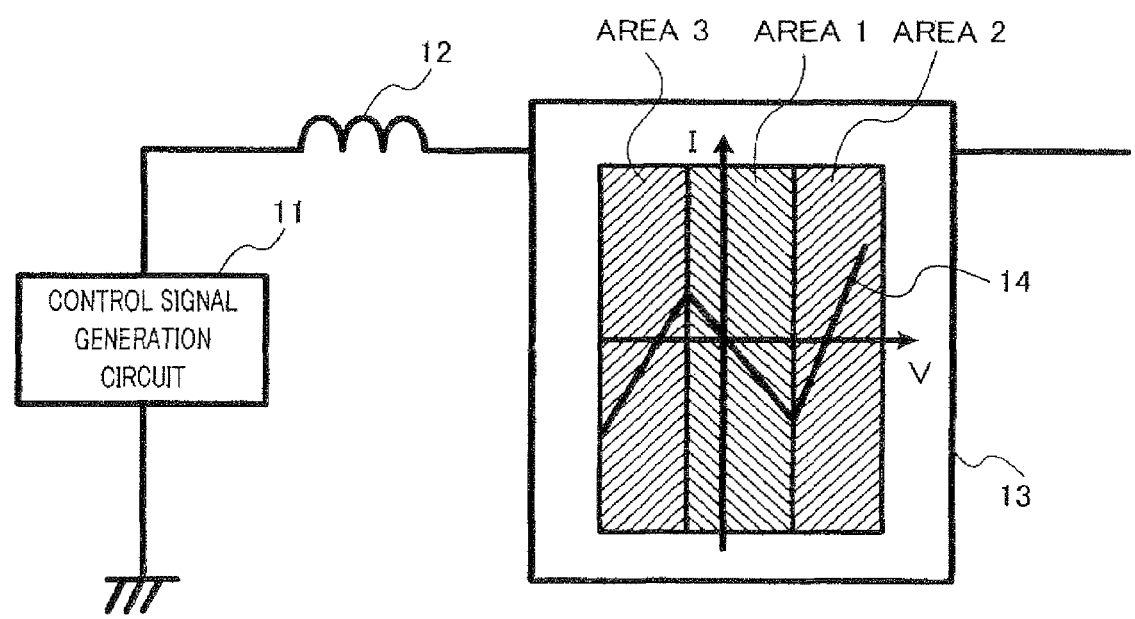
FIG. 1 is a drawing showing a sample configuration of a conventional intermittent operation circuit.
Figure 2:
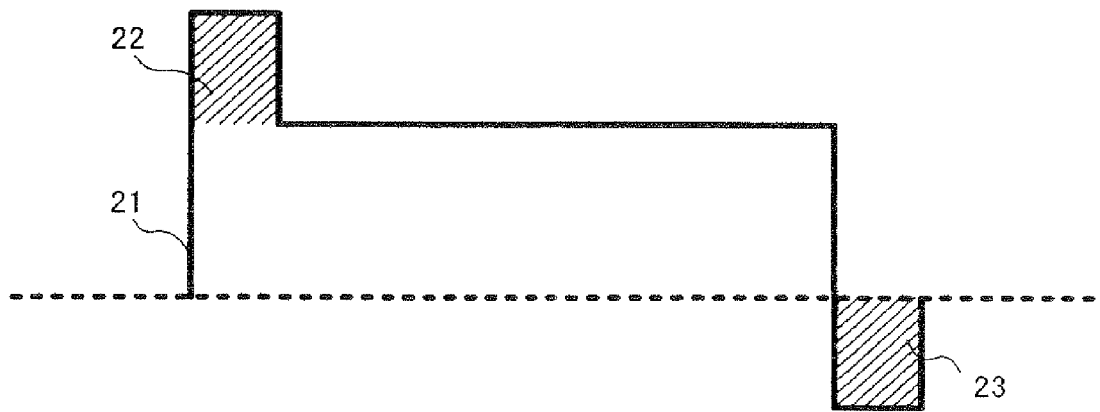
FIG. 2 is a drawing showing a control signal waveform input to a conventional intermittent operation circuit.
Figure 3:
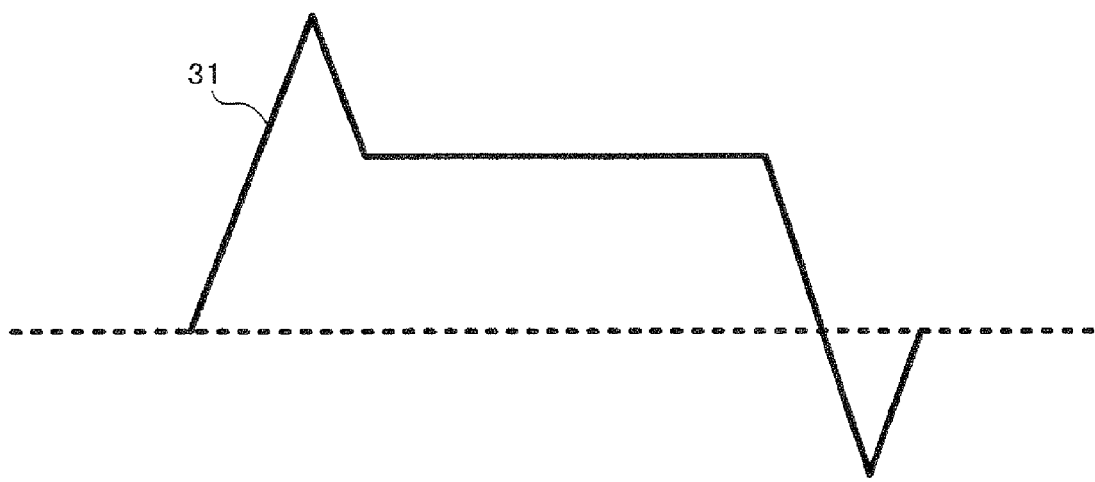
FIG. 3 is a drawing showing a control signal waveform input to a conventional intermittent operation circuit.
Figure 4:
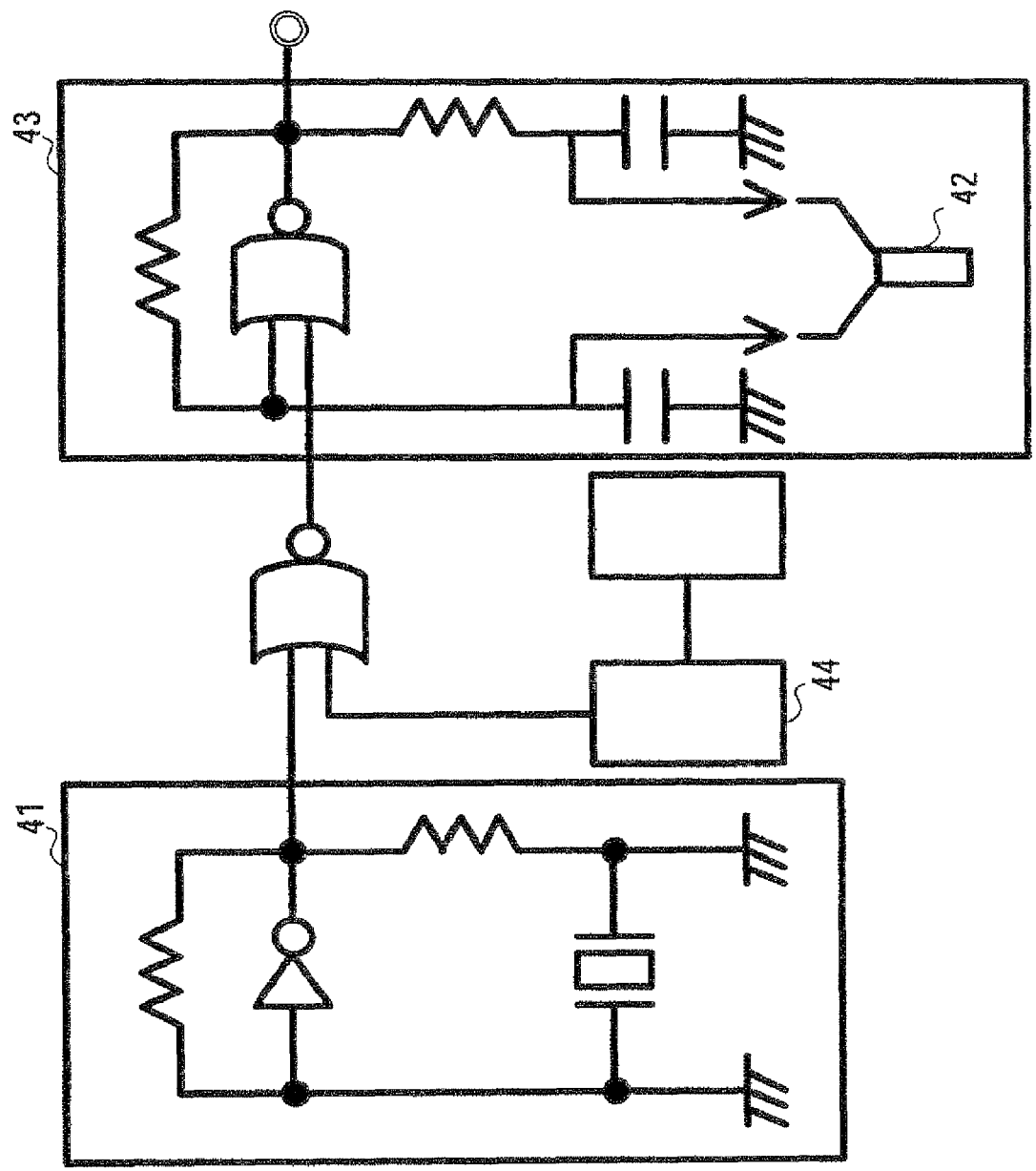
FIG. 4 is a connection diagram showing the circuit configuration of an oscillator applied to a conventional intermittent operation circuit.
Figure 5:
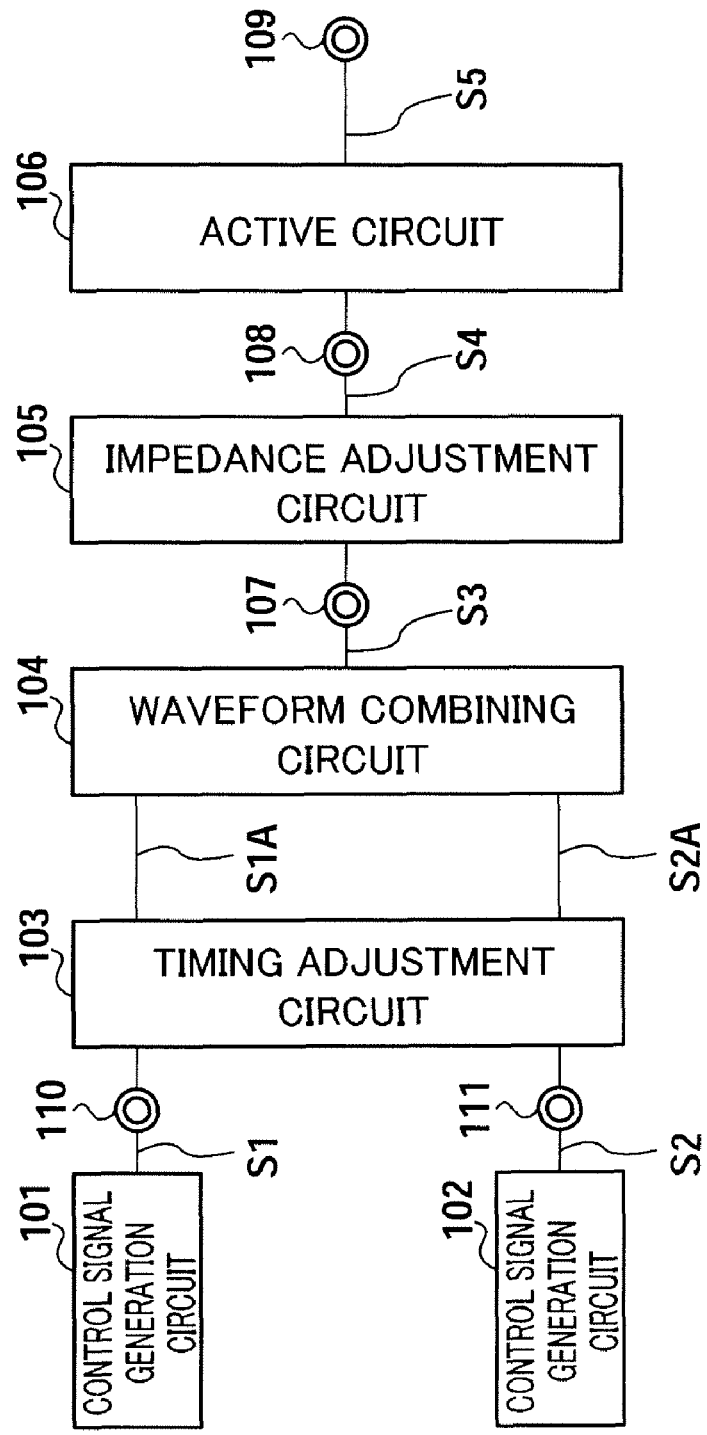
FIG. 5 is a block diagram showing a sample configuration of an intermittent operation circuit according to Embodiment 1 of the present invention.

FIG. 5 shows the configuration of an intermittent operation circuit according to Embodiment 1 of the present invention.

Intermittent operation circuit 100 has control signal generation circuits 101 and 102, a timing adjustment circuit 103, a waveform combining circuit 104, an impedance adjustment circuit 105, and an active circuit 106. Active circuit 106 is a circuit that includes a transistor or suchlike active element, such as an oscillator, for example.

Control signal generation circuit 101 generates a control signal S1, and control signal generation circuit 102 generates a control signal S2. The signal waveforms of S1 and S2 output by control signal generation circuits 101 and 102 are arbitrary, but will be assumed to be pulse waveforms in the following description.

Control signals S1 and S2 output from control signal generation circuits 101 and 102 are input to timing adjustment circuit 103 via terminals 110 and 111 respectively. Timing adjustment circuit 103 adjusts the time positions of control signals S1 and S2, and sends post-time-adjustment control signals S1A and S2A to waveform combining circuit 104. Waveform combining circuit 104 combines control signals S1A and S2A and sends a post-combining control signal S3 to impedance adjustment circuit 105 via a terminal 107. A control signal S4 adjusted by the impedance adjustment circuit is output to active circuit 106 via a terminal 108. Active circuit 106 is controlled by control signal S4, and outputs a short-pulse signal S5.

Figure 6A:
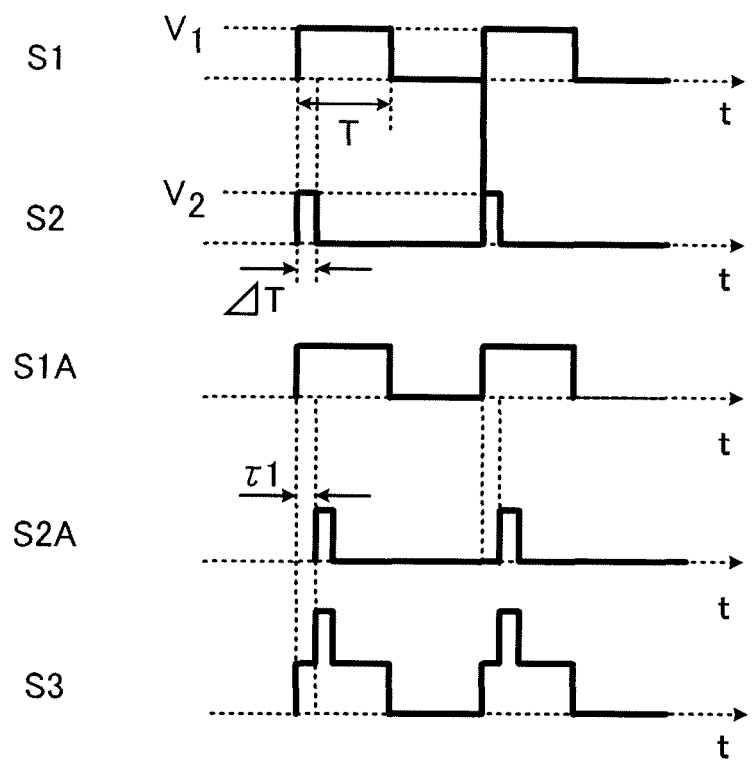
FIG. 6A is a timing chart showing the nature of control signal variation in the intermittent operation circuit in FIG. 5.
Figure 6B:
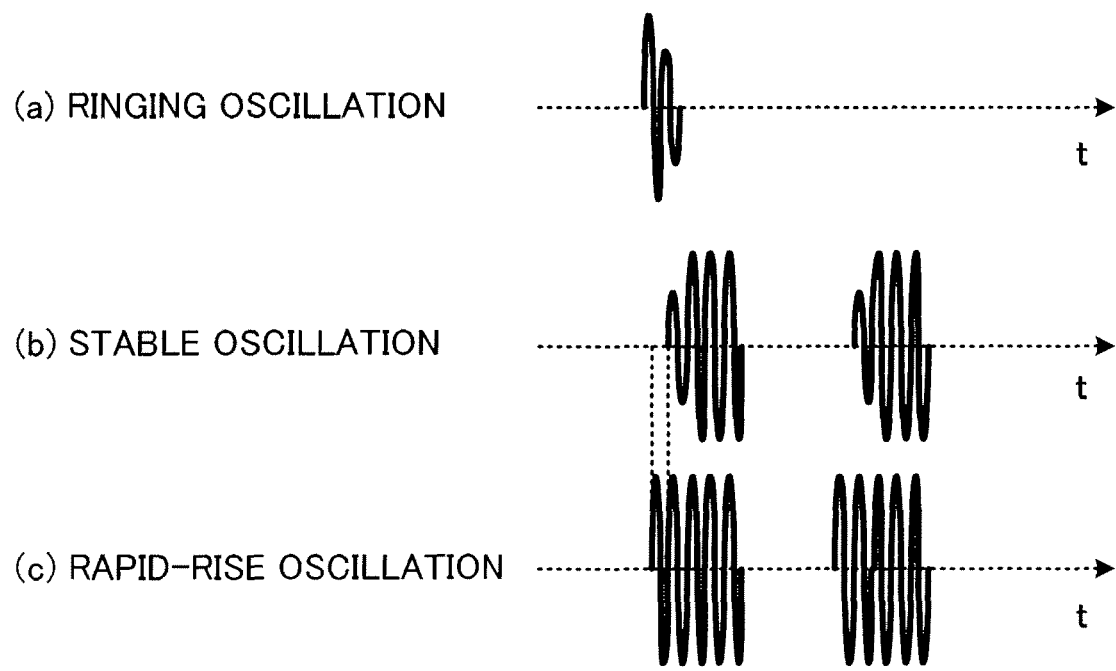
FIG. 6B is a waveform diagram explaining a short-pulse signal output from an active circuit.

FIG. 6A shows the states of the control signals shown in FIG. 5, and FIG. 6B shows sample states of a short-pulse signal output from the amplifier. In FIG. 6A and FIG. 6B, the vertical axes all represent voltage, and the horizontal axes all represent time.

Next, the operation of intermittent operation circuit 100 of this embodiment will be described using FIG. 5, FIG. 6A, and FIG. 6B.

Control signal S1 is output from control signal generation circuit 101, and control signal S2 is output from control signal generation circuit 102.

Control signal S1 controls operation starting and operation ending for active circuit 106, and is a control signal for intermittently outputting oscillation output by the operation of active circuit 106 (hereinafter referred to as stable oscillation, corresponding to oscillation when active circuit 106 is an oscillator, and to amplified oscillation or frequency-multiplied harmonic oscillation when active circuit 106 is an amplifier or frequency multiplier). Voltage value $V_1$ of control signal S1 is a voltage value necessary for the active element included in active circuit 106 to perform the desired operation, and period T is the time for which the circuit is made to operate intermittently. Time T may be longer or shorter depending on the impedance of the transmission path on which control signal S1 is propagated.

Control signal S2 is a control signal for causing active circuit 106 to perform ringing oscillation. The rise of control signal S2 is steeper (including a high-frequency component) than that of control signal S1, the gradient being determined by the relationship between the performance (transconductance gm or circuit impedance) of active circuit 106 and impedance adjustment circuit 105, with time width ΔT being taken to be the period of ringing oscillation generated by active circuit 106, or a close value. Voltage value $V_2$ can control the amplitude value of generated ringing oscillation according to its value.

Also, through its electrical energy, control signal S2 contributes to the charges of inter-terminal capacitance of the active element and floating capacitance present in the circuit.

The relationship between ringing generation conditions, the gradient of control signal S2, and active circuit 106 and impedance adjustment circuit 105, will be described later herein.

Control signals S1 and S2 have their time positions adjusted by timing adjustment circuit 103, and become post-time-adjustment control signals S1A and S2A.

Time difference τ1 in FIG. 6A is adjusted so that ringing oscillation and stable oscillation generated by active circuit 106 are output continuatively, and the relevant timing can be decided upon in the design stage. In FIG. 6A, time difference τ1 is shown such that control signal S2A lags temporally behind control signal S1A, but this is not a limitation, and this time relationship may be reversed, or τ1 may be 0 (zero), depending on the characteristics of active circuit 106. In an actual circuit, timing adjustment circuit 103 can easily by implemented by means of lines of different lengths.

Control signals S1A and S2A output from timing adjustment circuit 103 undergo waveform combining by waveform combining circuit 104, and become control signal S3. Control signal S3 is input to active circuit 106 via impedance adjustment circuit 105.

Impedance adjustment circuit 105 is a passive circuit configured, for example, by means of an inductive element, capacitative element, microstrip line, etc., and converts impedance when the active circuit 106 side is viewed from terminal 107.

In this embodiment, the relationship between the gradient of control signal S2, active circuit 106, and impedance adjustment circuit 105, is set as follows. Namely, in this embodiment, an impedance adjustment circuit 105 circuit constant and the gradient of control signal S2 are determined so that a damping constant K determined by the impedance of circuitry including impedance adjustment circuit 105 and active circuit 106 is less than 1 (ringing generation condition), and the frequency of the generated ringing oscillation is the same as that of stable oscillation, or a close value.

When the value of damping constant K becomes less than 1, ringing oscillation occurs in the circuit. Damping constant K is represented by the following equation when s is the solution of a Laplace transform in the transfer function of the circuit.

$$s^2 + 2K\omega s + \omega^2 = 0 \quad (1)$$

Since ringing oscillation is decided by the impedance of the circuit viewed from the input terminal and the gradient of the control signal when a control signal with a steep gradient is input to the circuit, control signal S2A, unlike control signal S1A, contributes to ringing oscillation generation without the waveform being rounded due to inter-terminal capacitance of the active element or floating capacitance present in the circuit. Therefore, the frequency of ringing oscillation (FIG. 6B (a)) that appears in active circuit 106 can be made a desired frequency component by determining impedance adjustment circuit 105 and the gradient of control signal S2.

Also, since the amplitude of ringing oscillation is decided by the impedance of the circuit to which a control signal with a steep gradient is input and the voltage value of the control signal, the amplitude value of ringing oscillation can be controlled by determining impedance adjustment circuit 105 and voltage value $V_2$ of control signal S2. The principle of generation of stable oscillation (FIG. 6B (b)) is known technology, and therefore a description thereof is omitted here.

Oscillation can be continued without interruption from ringing oscillation (FIG. 6B (a)) to stable oscillation (FIG. 6B (b)) by temporally adjusting control signals S1 and S2 at above-described τ1 timing by means of timing adjustment circuit 103. Also, when active circuit 106 is an oscillator, temporally adjusting control signals S1 and S2 at above-described τ1 timing by means of timing adjustment circuit 103 enables an effect to be obtained whereby the growth of oscillation is boosted by ringing, and consequently a rapid-rise signal (FIG. 6B (c)) is output.

(2) Control Signal Generation Circuits

The configuration of control signal generation circuit 101 only requires the application of known technology, and therefore a description thereof will be omitted. Control signal generation circuit 102 will be described here.

Figure 7:
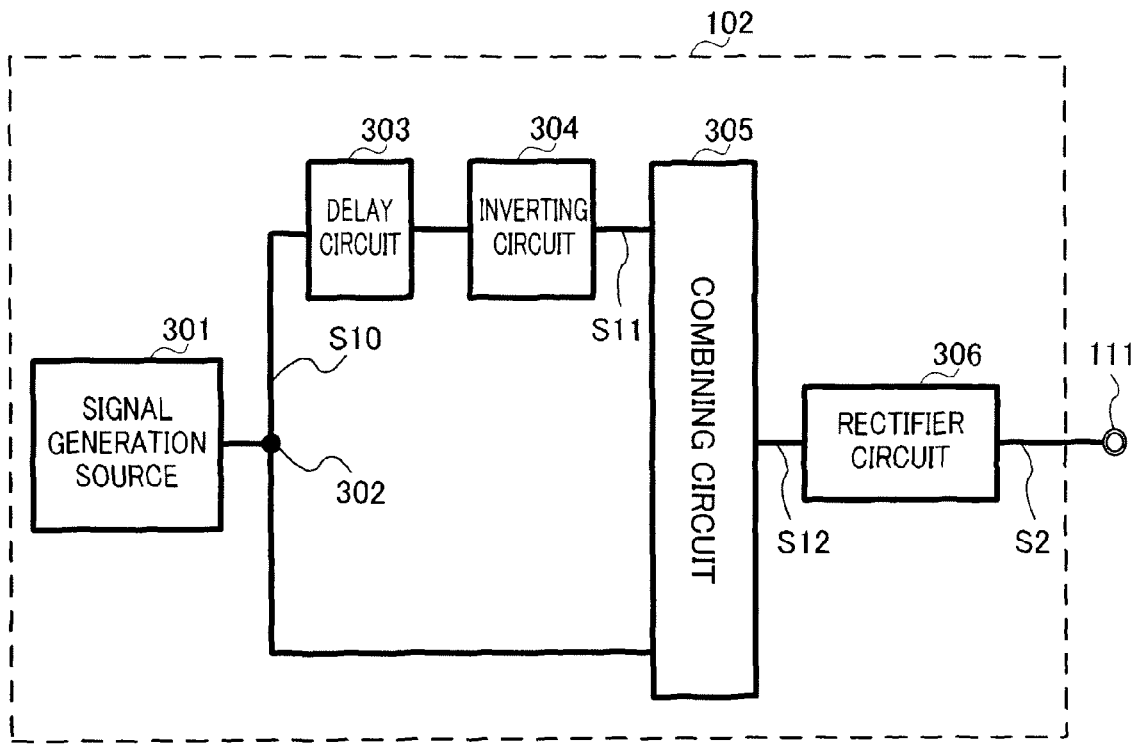
FIG. 7 is a block diagram showing a sample configuration of a control signal generation circuit.
Figure 8:
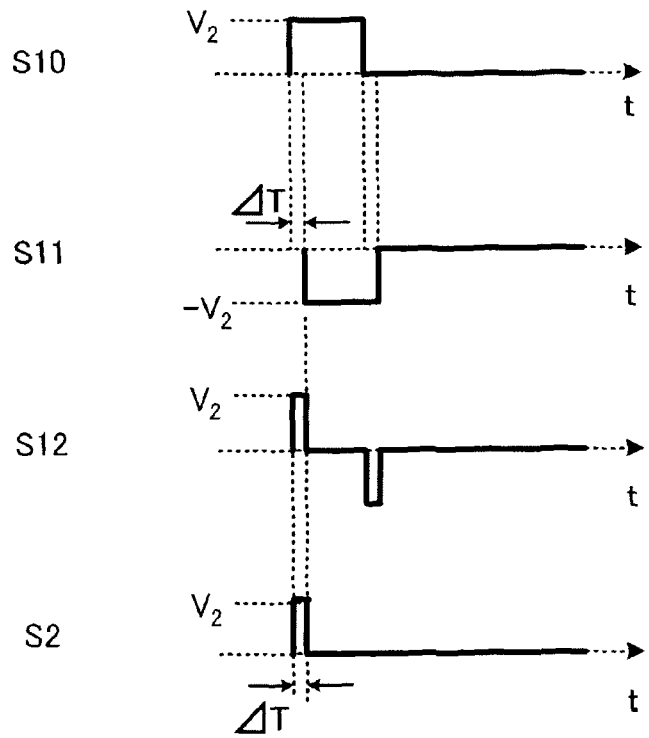
FIG. 8 is a timing chart showing the nature of control signal variation in the control signal generation circuit in FIG. 7.

FIG. 7 shows a sample configuration of control signal generation circuit 102, and FIG. 8 shows the nature of control signal variation in the control signal generation circuit in FIG. 7. In FIG. 8, the vertical axes all represent voltage, and the horizontal axes all represent time.

As described above, control signal generation circuit 102 generates a voltage value $V_2$ control signal S2 having arbitrary rise and fall gradients.

As shown in FIG. 7, control signal generation circuit 102 has a signal generation source 301 that is designed using known technology as in the case of control signal generation circuit 101, and outputs a signal S10. Signal S10 branches into two signals at a branch point 302. One signal is input to a delay circuit 303 and is delayed by ΔT, where ΔT is time width ΔT shown in FIG. 6A. The signal delayed by ΔT is input to an inverting circuit 304 where positive/negative voltage inversion is performed, and an inverted signal S11 such as shown in FIG. 8 is thereby obtained. Inverted signal S11 is combined with the other signal branching from branch point 302 by means of a combining circuit 305, and a combined signal S12 such as shown in FIG. 8 is thereby obtained. Combined signal S12 is input to a rectifier circuit 306 such as a clipping circuit or rectification circuit, whereby final control signal S2 is output. The rise and fall gradients of control signal S2 can be set beforehand by means of signal generation source 301.

Figure 9:
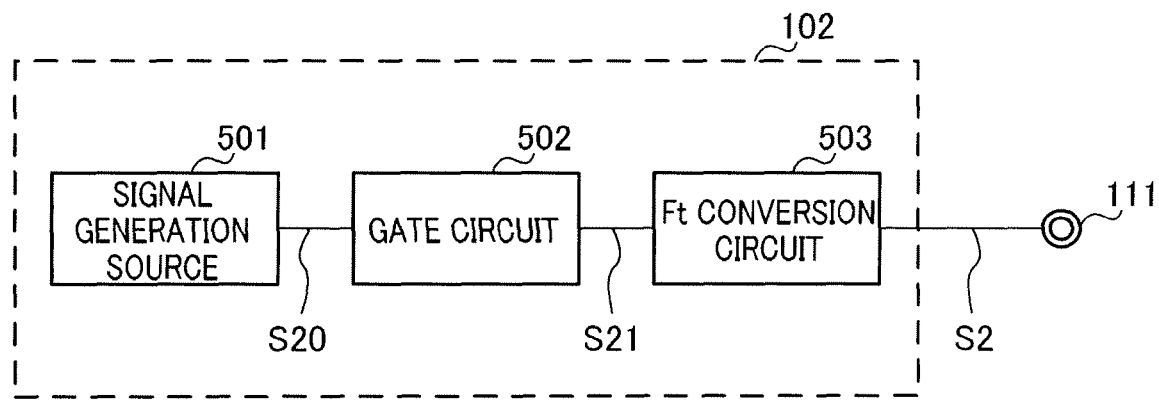
FIG. 9 is a block diagram showing another sample configuration of a control signal generation circuit according to Embodiment 1.
Figure 10:
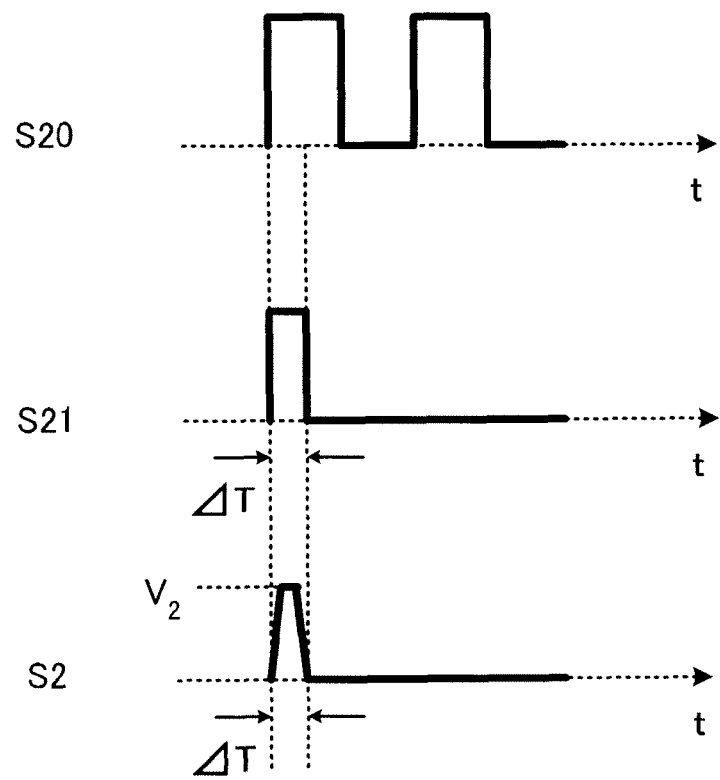
FIG. 10 is a timing chart showing the nature of control signal variation in the control signal generation circuit in FIG. 9.

FIG. 9 shows another sample configuration of control signal generation circuit 102. The sample configuration in FIG. 9 generates control signal S2 digitally. Control signal generation circuit 102 in FIG. 9 has a signal generation source 501, a gate circuit 502, and an Ft conversion circuit 503. Ft conversion circuit 503 is a circuit that converts a transition time. FIG. 10 shows the nature of control signal variation in the control signal generation circuit shown in FIG. 9. In FIG. 10, the vertical axes all represent voltage, and the horizontal axes all represent time.

A control signal S20 output from signal generation source 501 is input to gate circuit 502, where a time ΔT from the rise starting point is extracted and a control signal S21 is output. Control signal S21 is input to Ft conversion circuit 503, and becomes control signal S2 with rise and fall gradients determined by the characteristics of Ft conversion circuit 503. The rise and fall gradients of control signal S2 can be set by the performance of Ft conversion circuit 503.

Figure 11:
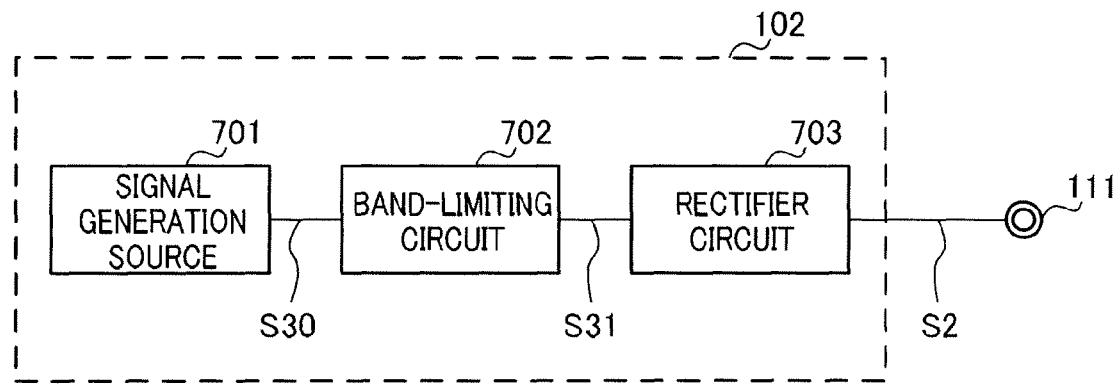
FIG. 11 is a block diagram showing another sample configuration of a control signal generation circuit according to Embodiment 1.
Figure 12:
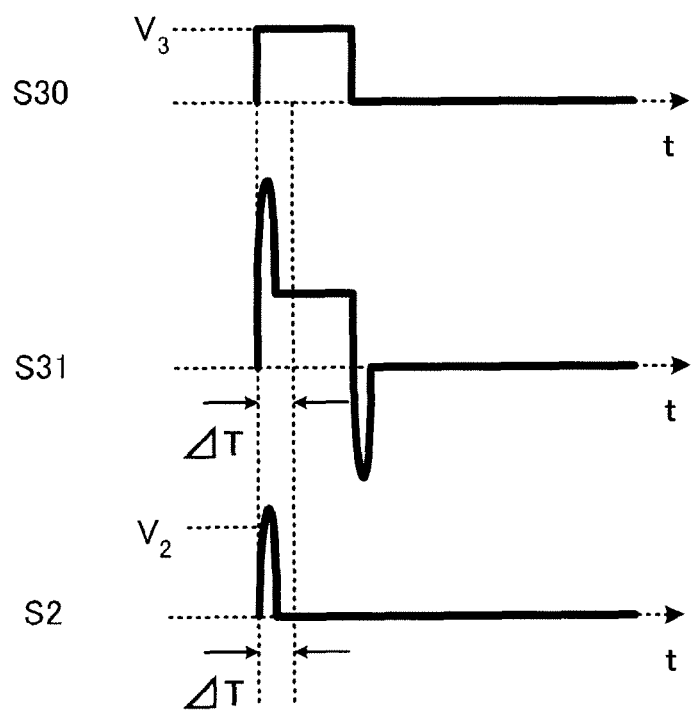
FIG. 12 is a timing chart showing the nature of control signal variation in the control signal generation circuit in FIG. 11.

FIG. 11 shows another sample configuration of control signal generation circuit 102. The sample configuration in FIG. 11 generates control signal S2 in analog fashion. Control signal generation circuit 102 in FIG. 11 has a signal generation source 701, a band-limiting circuit 702, and a rectifier circuit 703. FIG. 12 shows the nature of control signal variation in the control signal generation circuit shown in FIG. 11. In FIG. 12, the vertical axes all represent voltage, and the horizontal axes all represent time.

Figure 13:
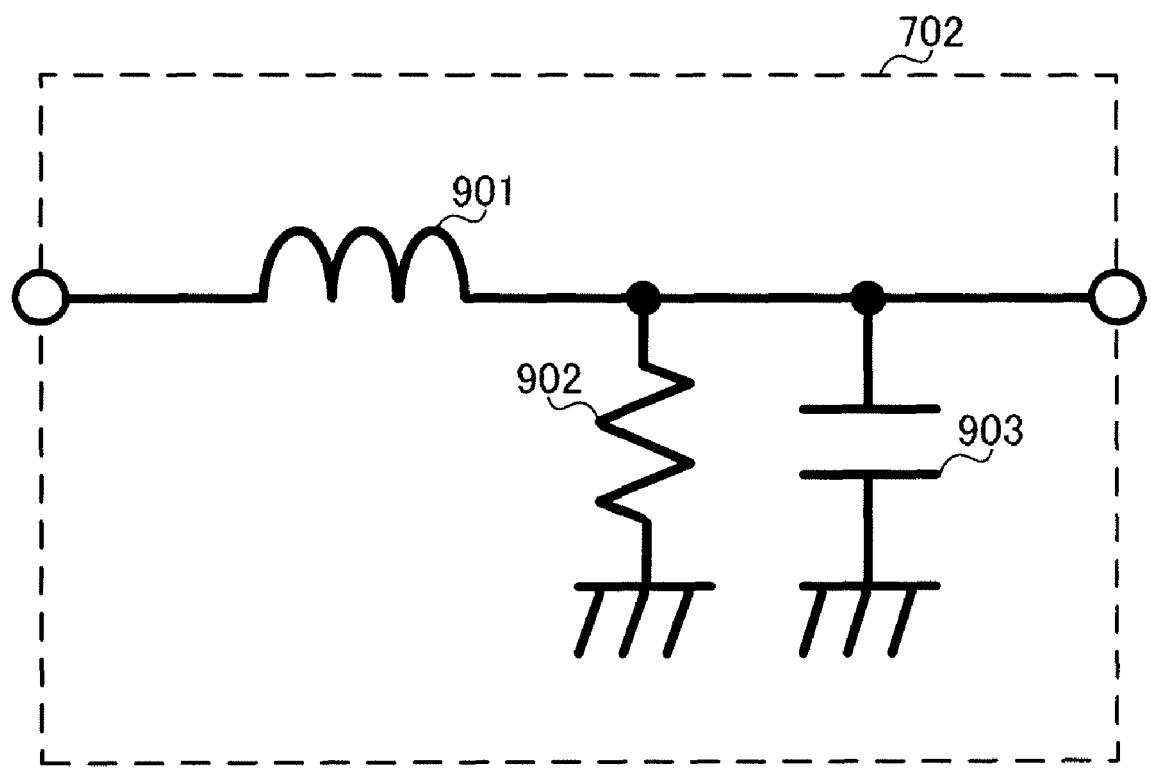
FIG. 13 is a connection diagram showing a sample configuration of a band-limiting circuit.

A voltage value $V_3$ control signal S30 output from signal generation source 701 is input to band-limiting circuit 702. Band-limiting circuit 702 is a passive circuit comprising an inductor 901, a resistor 902, and a capacitor 903, for example, as shown in FIG. 13. Control signal S30 is made a signal S31 in which overshoot occurs in the rise and fall by band-limiting circuit 702. This overshoot period ΔT is the same as ΔT shown in FIG. 6A, and overshoot voltage value $V_2$ is voltage value $V_2$ shown in FIG. 6A. ΔT can be set by the impedance of band-limiting circuit 702, and voltage value $V_2$ can be set by the impedance of band-limiting circuit 702 and voltage value $V_3$ of control signal S30. Control signal S31 in which overshoot occurs in the rise and fall is input to rectifier circuit 703 such as a clipping circuit or rectification circuit using a diode having a rectifying action, and only a signal component greater than or equal to voltage value $V_3$ or a close voltage value is output as control signal S2. The rise and fall gradients of control signal S2 can be set beforehand by the performance of band-limiting circuit 702.

The rise and fall of control signal S20 and control signal S30 are assumed to be sufficiently steep, but if the rise and fall are gradual, a driver circuit can be installed in a stage subsequent to signal generation source 501 or signal generation source 701.

(3) Active Circuit

Figure 14:
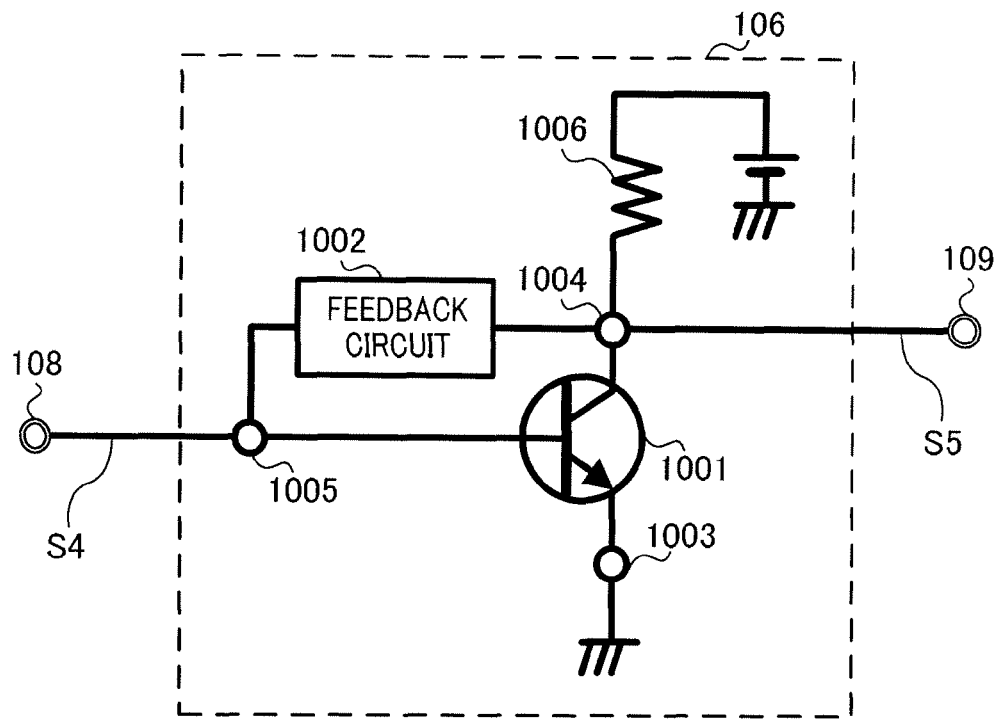
FIG. 14 is a connection diagram showing a sample configuration of an active circuit.

FIG. 14 shows a sample configuration of active circuit 106. Active circuit 106 shown in FIG. 14 is an oscillator, and has an active element 1001, a feedback circuit 1002, terminals 1003, 1004, and 1005, and a resistor 1006. Here, active element 1001 is a transistor, terminal 1003 is the emitter terminal, terminal 1004 is the collector terminal, and terminal 1005 is the base terminal. For simplicity, an input/output coupling capacitor, damping resistor, bypass capacitor, and bypass resistor are omitted from the drawing. As the circuit configuration of an oscillator, a common-emitter inverting amplifier circuit is used, feedback circuit 1002 is actually a parallel resonant circuit, and when the oscillator is designed using a distributed constant line, the parallel resonant circuit is replaced by stubs provided for the emitter terminal, base terminal, and collector terminal. As the operating principle of intermittent operation, the oscillator is made to operate intermittently by directly controlling the inter-terminal voltage between terminal 1003 and terminal 1005 by means of control signal S4 input from terminal 108 while a bias voltage is constantly applied from terminal 1004.

Figure 15:
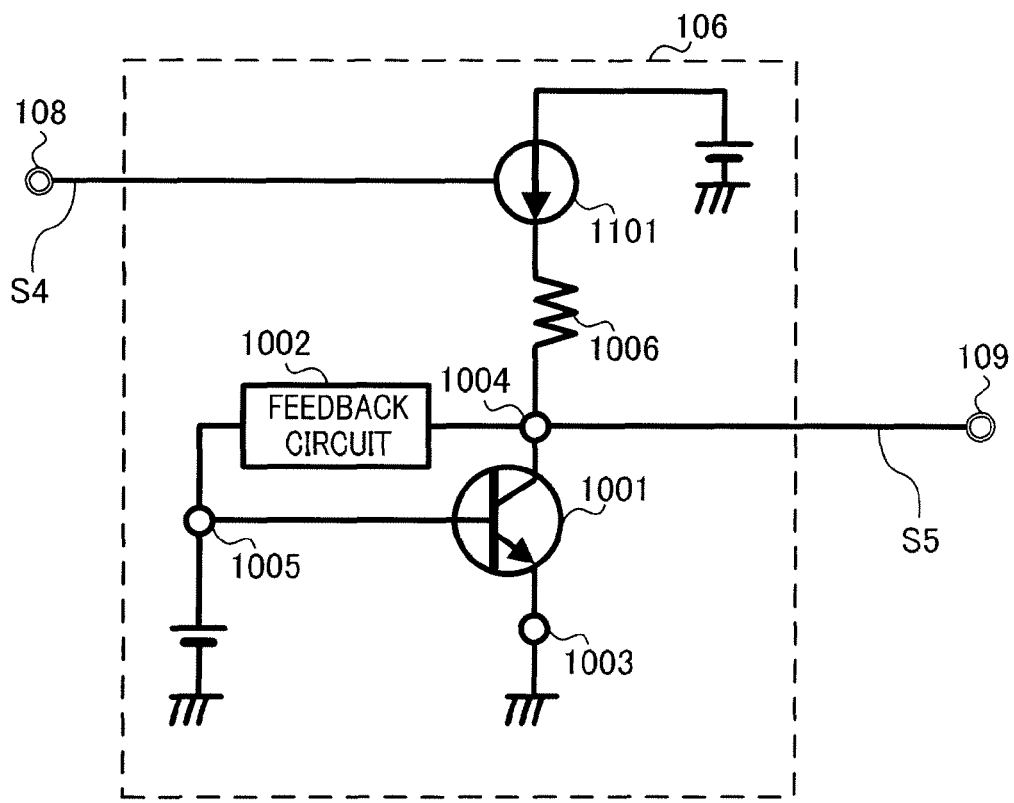
FIG. 15 is a connection diagram showing a sample configuration of an active circuit.

FIG. 15 shows another sample configuration of active circuit 106. Active circuit 106 shown in FIG. 15 is an oscillator, and has an active element 1001, a feedback circuit 1002, terminals 1003, 1004, and 1005, a resistor 1006, and a current source switch circuit 1101. As the operating principle of intermittent operation, the oscillator is made to operate intermittently by causing current source switch circuit 1101 to operate intermittently by means of control signal S4 input from terminal 108, and turning the circuit collector current on/off, while the collector terminal 1004 side constant-current source is constantly connected, and a bias voltage is constantly applied from base terminal 1005. Current source switch circuit 1101 is configured by means of a transistor or diode in the commonly-known way.

(4) Advantageous Effect of the Embodiment, and Sample Variants

As described above, according to this embodiment an intermittent operation circuit 100 having a rapid output waveform rise can be implemented by generating ringing oscillation and stable oscillation using a first control signal generation circuit 101, a second control signal generation circuit 102, a timing adjustment circuit 103, a waveform combining circuit 104, an impedance adjustment circuit 105, and an active circuit 106, and setting a circuit constant and the voltage value of a first control signal S1, and the gradient and voltage value of a second control signal S2, so that their frequency components become the same or close values.

A configuration may also be used whereby timing adjustment circuit 103 is included in first and second control signal generation circuits 101 and 102, for example. That is to say, the above-described kind of timing adjustment function may also be implemented by first and second control signal generation circuits 101 and 102.

In the above embodiment, the amplitude value of ringing oscillation of generated short-pulse signal S5 has not been specifically stipulated, but the ringing amplitude value can be controlled by voltage value $V_2$ of control signal S2. In order to speed up the rise of the waveform of short-pulse signal S5 output from active circuit 106, it is desirable for the amplitude value of short-pulse signal S5 ringing oscillation to be made the same as the amplitude value of active circuit 106 stable oscillation, or a close value. Also, since the envelope of an output waveform is decided by the amplitude value of ringing oscillation, if a ringing amplitude value is set so that the envelope of signal S5 meets the channel band specification in radio communication system specifications, a channel filter is unnecessary, or the spec is relaxed.

In the description of the above embodiment, it has been assumed that the voltage value of control signal S2 for speeding up the rise of short-pulse signal S5 is positive, but the rise of short-pulse signal S5 can also be speeded up in the same way if the voltage value of control signal S2 is made negative. If this is done, the amplitude value ringing generated by active circuit 106 also becomes negative. Thus, the phase of intermittent operation circuit 100 output including ringing oscillation can be controlled according to whether the control signal S2 voltage value is positive or negative. In this case, it is necessary to provide control signal generation circuit 102 with a separate inverting circuit after the Ft conversion circuit 503 in FIG. 9 in a stage subsequent to the rectifier circuit in FIG. 7 or FIG. 11.

In the above embodiment, control signal S2 for speeding up the rise of short-pulse signal S5 has been described as having a steep rise, but a signal including a frequency component necessary for generating ringing oscillation having a desired frequency and amplitude may also be used.

In the above embodiment, a frequency component of control signal S2 for speeding up the rise of short-pulse signal S5 has been described as a single frequency band, but a frequency component of the operating frequency of active circuit 106 may also be included.

In the above embodiment, an intermittent operation circuit for speeding up the rise of short-pulse signal S5 has been described, but if a control signal having gradient and voltage level absolute values that are the same as or close to those of control signal S2 is input to the circuit at control signal S2 fall timing, the fall of the output waveform can also be speeded up, and an intermittent operation circuit with a rapid output waveform rise and fall can be implemented.

In the above embodiment, circuit impedance viewed from input terminal 107 is adjusted using impedance adjustment circuit 105, but if the circuit impedance of active circuit 106 meets a desired condition, impedance adjustment circuit 105 may be omitted.

In the above embodiment, control signal S1 and control signal S2 undergo waveform combining by waveform combining circuit 104 via timing adjustment circuit 103, and are input to terminal 108 of active circuit 106 as control signal S4, but control signal S3 and control signal S2 may also be input to separate terminals without undergoing waveform combining.

Figure 16:
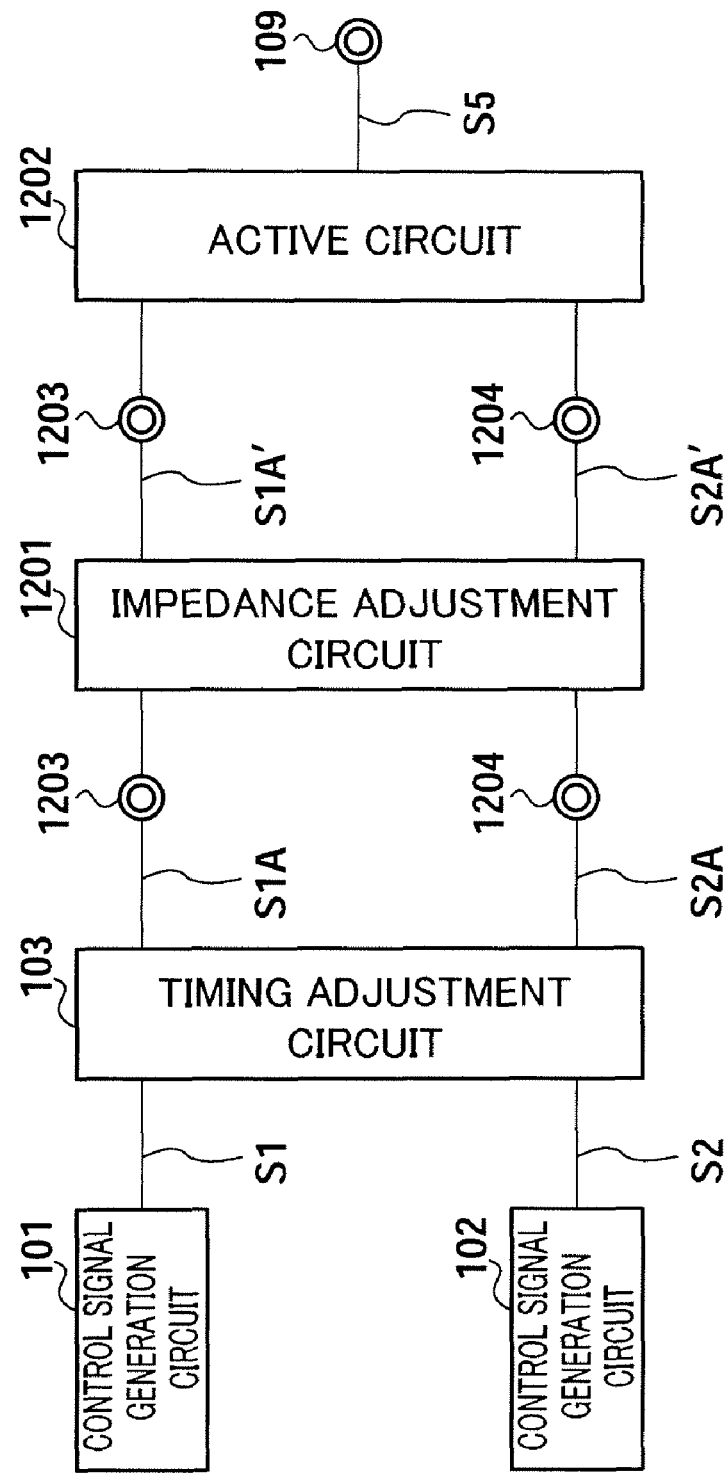
FIG. 16 is a block diagram showing another sample configuration of an intermittent operation circuit according to Embodiment 1.

FIG. 16 shows a sample configuration of an intermittent operation circuit that allows control signal S1 and control signal S2 to be input individually to separate terminals. In FIG. 16, in which parts corresponding to those in FIG. 5 are assigned the same reference codes as in FIG. 5, an intermittent operation circuit 1200 has a control signal generation circuit 101, a control signal generation circuit 102, a timing adjustment circuit 103, an impedance adjustment circuit 1201, and an active circuit 1202. The operation from generation of control signals S1 and S2 by control signal generation circuits 101 and 102 to input to impedance adjustment circuit 1201 is similar to that described above with reference to FIG. 5, and therefore a description thereof is omitted here. Impedance adjustment circuit 1201 performs impedance adjustment for control signals S1A and S2A respectively, and outputs impedance-adjusted control signals S1A' and S2A'.

Figure 17:
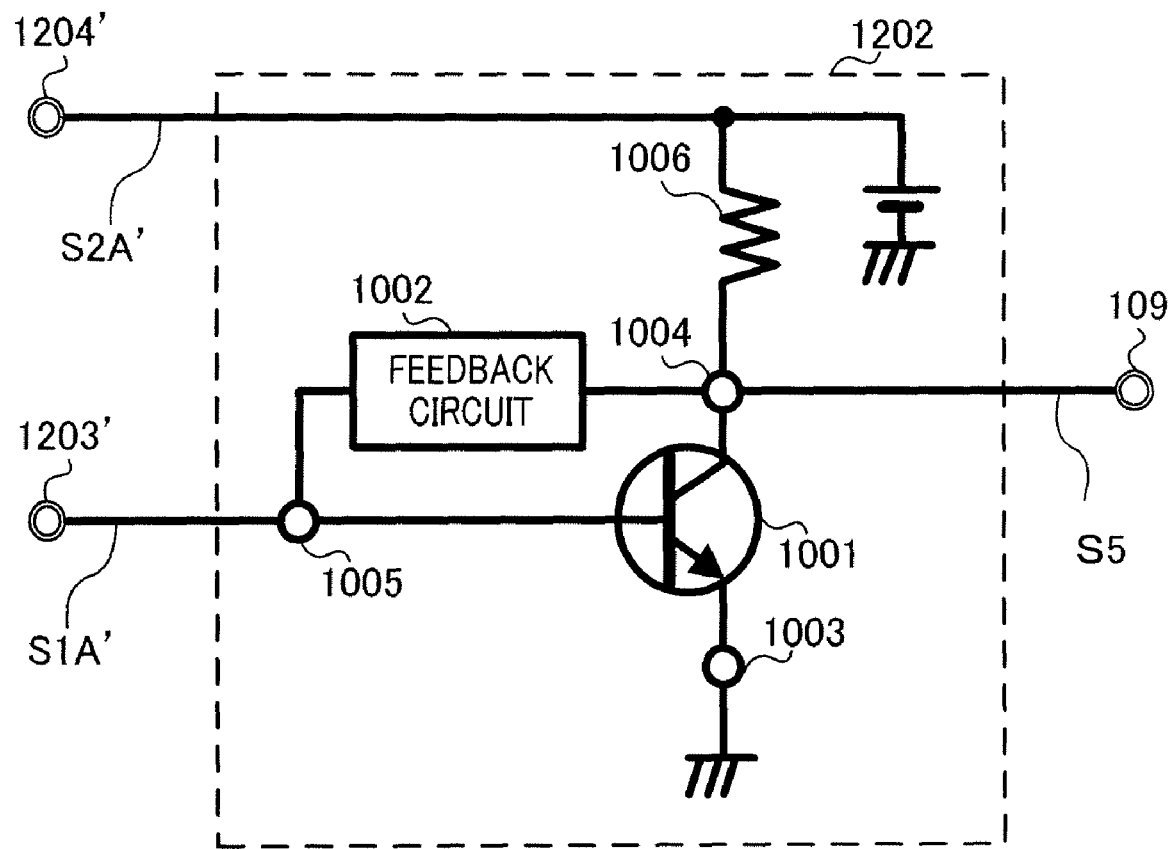
FIG. 17 is a connection diagram showing a sample configuration of the active circuit in FIG. 16.

FIG. 17 shows a sample configuration of active circuit 1202. Active circuit 1202 shown in FIG. 17 differs from active circuit 106 shown in FIG. 14 in that terminal 108 is replaced by a terminal 1203' and in having a terminal 1204' connected to collector terminal 1004, while other configuration elements are the same. In active circuit 1202, control signal S2A' is input via terminal 1204', and control signal S1A' is input via terminal 1203'. In the oscillator in FIG. 17, control signal S2A' from terminal 1204' may also be input to emitter terminal 1003. A configuration in which control signal S1 and control signal S2 do not undergo waveform combining and are input from two terminals can also use the kind of current source switch shown in FIG. 15.

In the above embodiment, a case has been described in which a transistor is used as an active element, and negative resistance is formed by configuring an inverting amplifier circuit, but a negative resistor may also be used.

Figure 18:
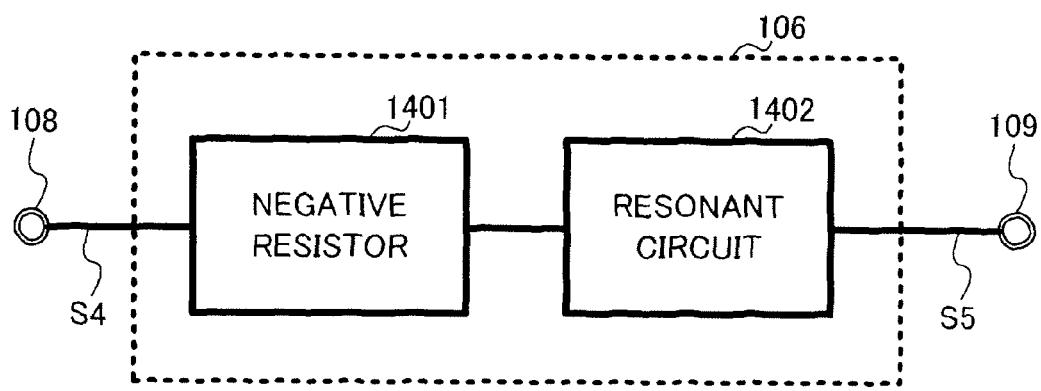
FIG. 18 is a block diagram showing a sample configuration of an active circuit using a negative resistor.
Figure 19:
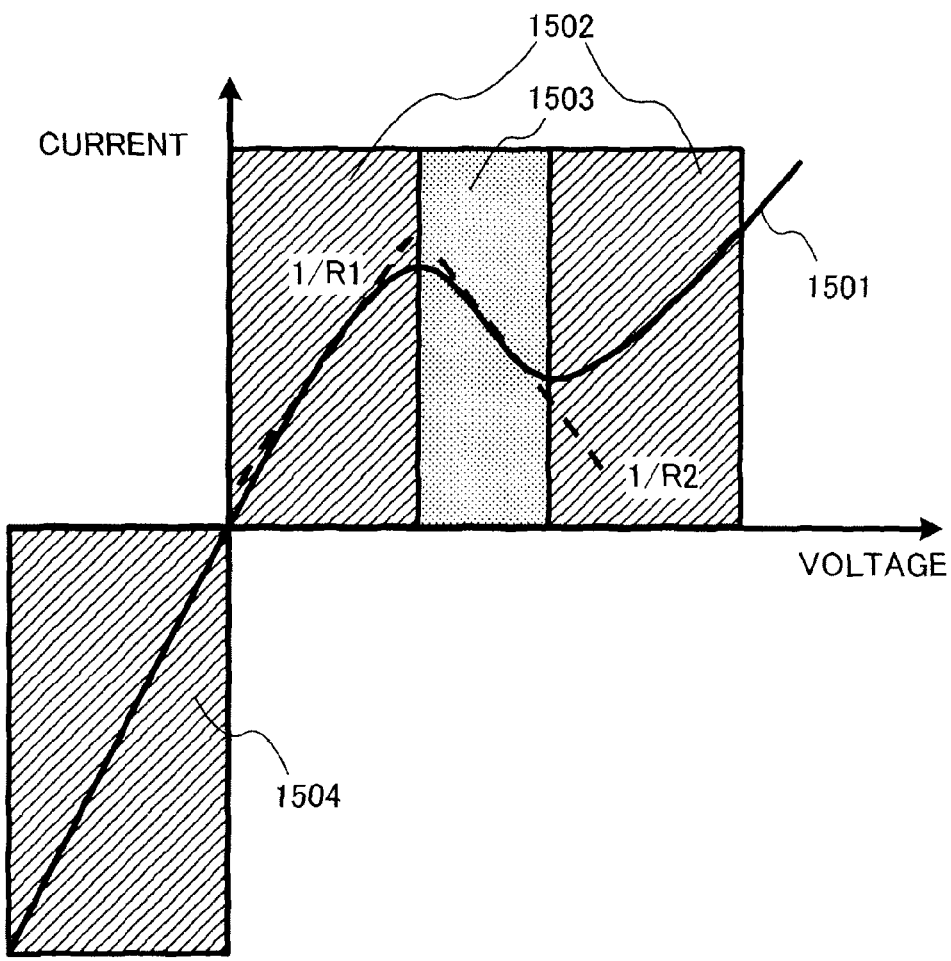
FIG. 19 is a characteristic diagram showing the voltage-current characteristic when a tunnel diode is used as a negative resistor.

FIG. 18 shows another sample configuration of active circuit 106. The oscillator shown in FIG. 18 comprises a negative resistor 1401 and a resonant circuit 1402. Here, negative resistor 1401 is a tunnel diode. FIG. 19 shows the voltage-current characteristic when a tunnel diode is used as a negative resistor. Voltage-current characteristic curve 1501 shows areas 1502 and 1504 in which the ratio between voltage and current is positive, and an area 1503 in which the ratio between voltage and current is negative. The resistance value of the negative resistor at the time of transient response displays a positive value in areas 1502 in which the ratio between voltage and current is positive, which are areas in which the negative resistor does not display a negative resistance component. A voltage applied to negative resistor 1401 is located in area 1503 in which the ratio between voltage and current of voltage-current characteristic curve 1501 is negative, and the amplitude value and frequency of stable oscillation is decided by circuit impedance, including that of negative resistor 1401 and resonant circuit 1402.

Figure 20:
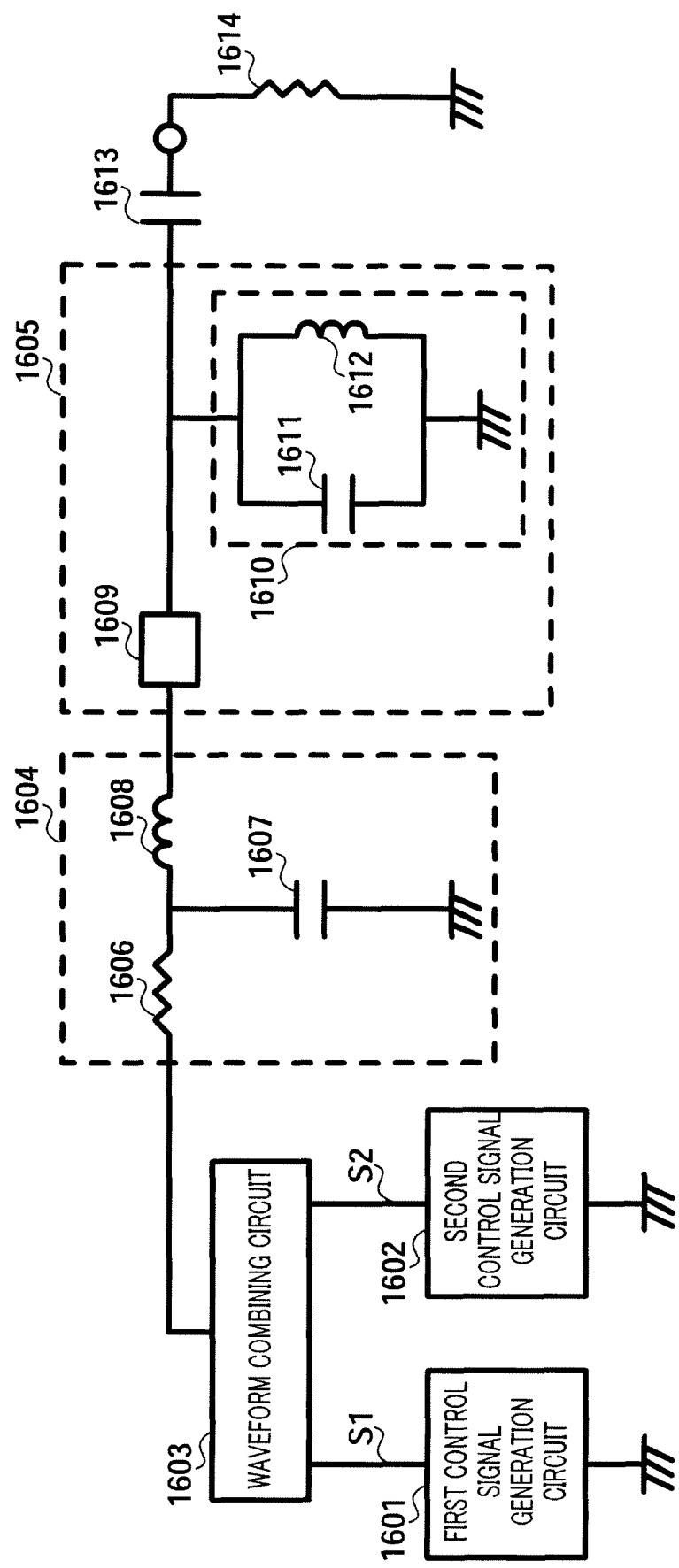
FIG. 20 is a drawing showing a more concrete sample configuration of an intermittent operation circuit of Embodiment 1.

FIG. 20 shows a sample implementation of an intermittent operation circuit. Intermittent operation circuit 1600 has control signal generation circuits 1601 and 1602, a waveform combining circuit 1603, an impedance adjustment circuit 1604, and an active circuit 1605. A timing adjustment circuit is not provided in this sample implementation. A signal having, for example, a 240 ps rise time, a 240 ps fall time, a 180 mV voltage, and a 240 ps pulse width is used as control signal S1 output from control signal generation circuit 1601, and a signal having a 240 ps rise time, a 1.5 ns fall time, a 150 mV voltage, and a 4.4 ns pulse width is used as control signal S2 output from control signal generation circuit 1602. Impedance adjustment circuit 1604 comprises, for example, a 100Ω resistor 1606, a 4.0 pF capacitative element 1607, and a 5.6 nH inductive element 1608. Active circuit (oscillator) 1605 comprises a tunnel diode 1609, and a resonant circuit 1610 composed of a 0.5 pF capacitative element 1611 and a 1.2 nH inductive element 1612. A capacitative element 1613 is for extracting a signal without any circuit output terminal effect by making a loose coupling, and a 0.5 pF capacitative element is used for this purpose. An impedance element 1614 is an output terminal load impedance, and a 50Ω impedance element is used for this purpose.

Figure 21:
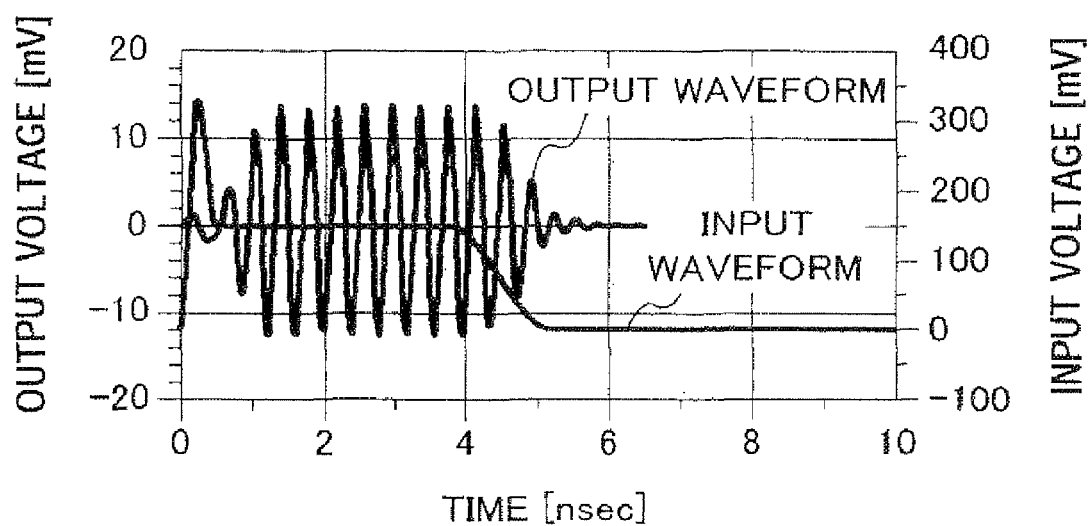
FIG. 21 is a characteristic diagram showing input/output waveforms of the intermittent operation circuit in FIG. 20.
Figure 22:
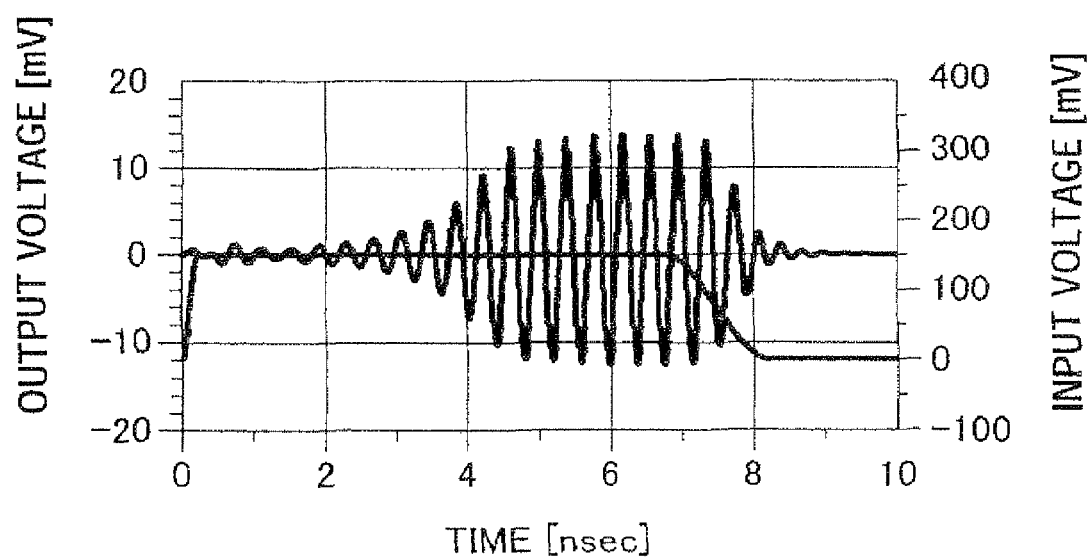
FIG. 22 is a characteristic diagram showing input/output waveforms of a conventional intermittent operation circuit.

FIG. 21 shows the input/output response of intermittent operation circuit 1600 in FIG. 20. When a width of 50% of the stable oscillation amplitude value is taken as the oscillation time, the oscillation time is 4 ns. Input/output response in the case of a conventional configuration is shown in FIG. 22. In FIG. 22, the input signal pulse width is assumed to be 7.4 ns so that the output waveform oscillation time is equal to the output waveform in FIG. 21. Comparing the output waveform in FIG. 21 with the output waveform in FIG. 22, it can be seen that use of the configuration in FIG. 20 rather than the conventional configuration enables the rise time to be shortened by 3.5 ns in obtaining the same 4 ns output pulse.

Figure 23:
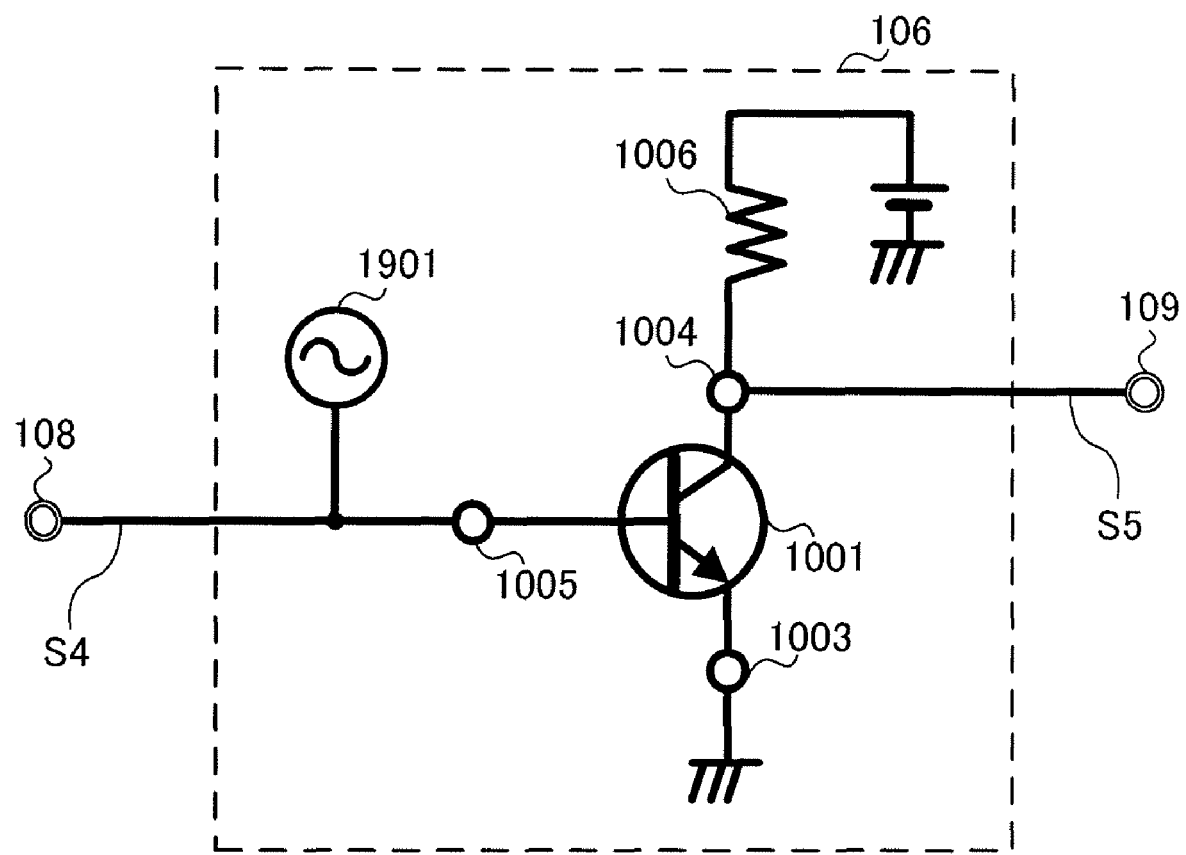
FIG. 23 is a connection diagram showing a sample configuration when an active circuit has an amplifier circuit configuration.

In the above description, a case has been described in which an oscillator is used as an active circuit, but an amplifier circuit may also be used as an active circuit. A sample configuration of an active circuit in this case is shown in FIG. 23. The amplifier circuit in FIG. 23, in which parts corresponding to those in FIG. 14 are assigned the same reference codes as in FIG. 14, differs from the circuit in FIG. 14 in that a high-frequency signal generation section 1901 for generating a high-frequency signal input to the amplifier circuit has been added, and the feedback circuit has been eliminated.

Furthermore, a frequency multiplier may also be used as an active circuit. In an active circuit in this case it is only necessary to add a high-frequency signal generation section for generating a high-frequency signal input to the frequency multiplier to the circuit in FIG. 14, and feedback circuit 1002 shown in FIG. 14 need not be provided. Also, it is necessary to set the gradient of control signal S2 and a circuit constant of the impedance adjustment circuit so that the ringing frequency is not the frequency of the high-frequency signal input to active circuit 106, but a frequency component resulting from multiplying that frequency.

In the above description, a case has been described in which pulse waveforms are used as control signals S1 and S2, but this is not a limitation, and sine waves, cosine waves, or waves combining these, may also be used as control signals S1 and S2.

In the above description, a case has been described in which two control signal generation circuits, 101 and 102, are used, but the three transistor terminals may all be controlled by using three or more control signal generation circuits, and control signals output from three or more control signal generation circuits may be combined.

In the above description, a case has been described in which an NPN-type transistor is used as a transistor, but a PNP-type transistor may also be used. In this case, the power supply should be made to correspond to the GND surface, and the GND surface to the power supply.

Also, in the above description, a case has been described in which a transistor is used as an active element, but an FET (field-effect transistor) may also be used. In this case, the base should be made to correspond to the gate, the collector to the drain, and the emitter to the source.

Embodiment 2

Figure 24:
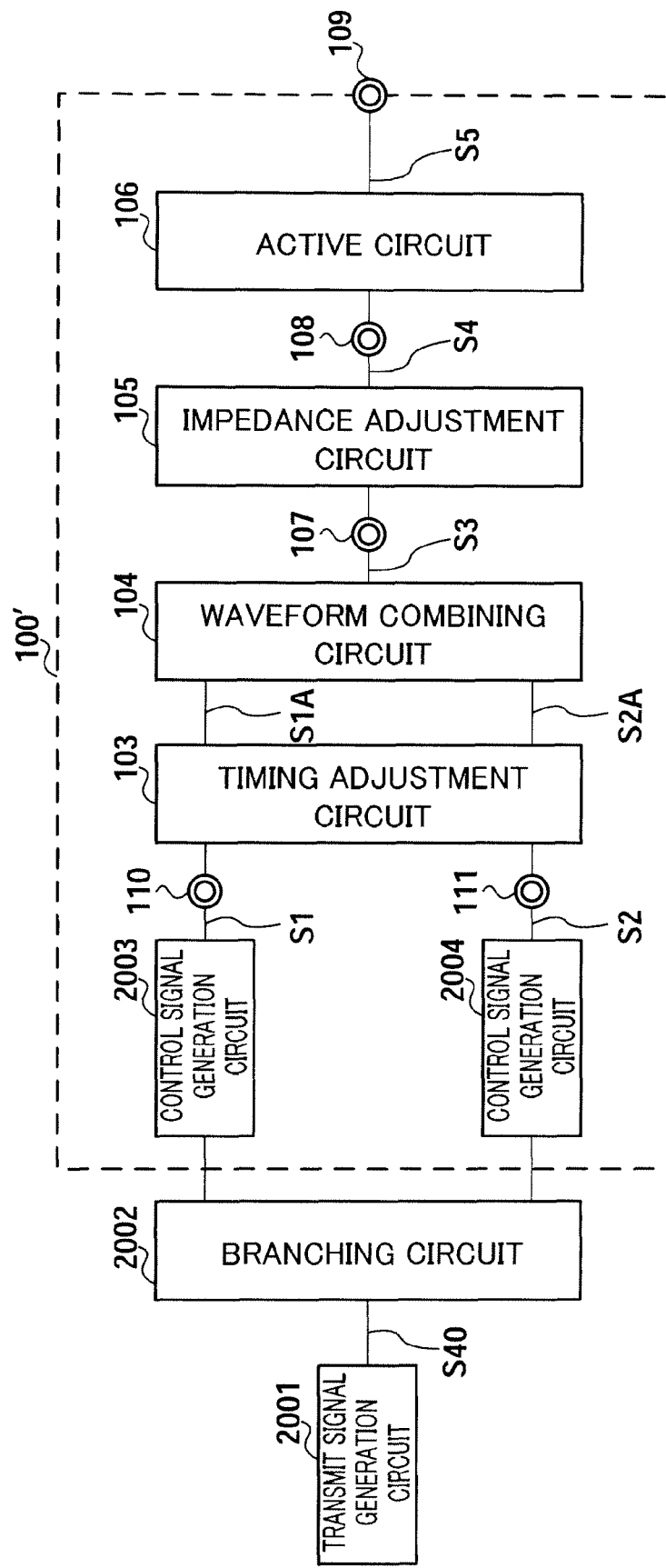
FIG. 24 is a block diagram showing a sample configuration of a modulator according to Embodiment 2 of the present invention.

FIG. 24, in which parts corresponding to those in FIG. 5 are assigned the same reference codes as in FIG. 5, shows the configuration of a modulator according to this embodiment. Modulator 2000 has a transmit signal generation circuit 2001, a branching circuit 2002, and an intermittent operation circuit 100' with virtually the same configuration as intermittent operation circuit 100 described in Embodiment 1. Intermittent operation circuit 100' has a control signal generation circuit 2003 and control signal generation circuit 2004.

Transmit signal generation circuit 2001 generates a transmit signal S40, and transmits this to branching circuit 2002. Branching circuit 2002 inputs transmit signal S40 to both control signal generation circuits 2003 and 2004. In the case of this embodiment, an identical transmit signal S40 is input to control signal generation circuit 2003 and control signal generation circuit 2004.

Modulator 2000 is designed so that the waveforms of control signals S1 and S2 can be controlled by means of the voltage value of transmit signal S40, and the voltage value of an output signal (short-pulse signal S5) output from intermittent operation circuit 100' can thereby be controlled arbitrarily. Control signal generation circuit 2004 can be taken as having a configuration such as to input a transmit signal instead of signal generation sources 301, 501, and 701 in the kind of circuit configurations illustrated in FIGS. 7 through 13 of Embodiment 1.

Figure 25:
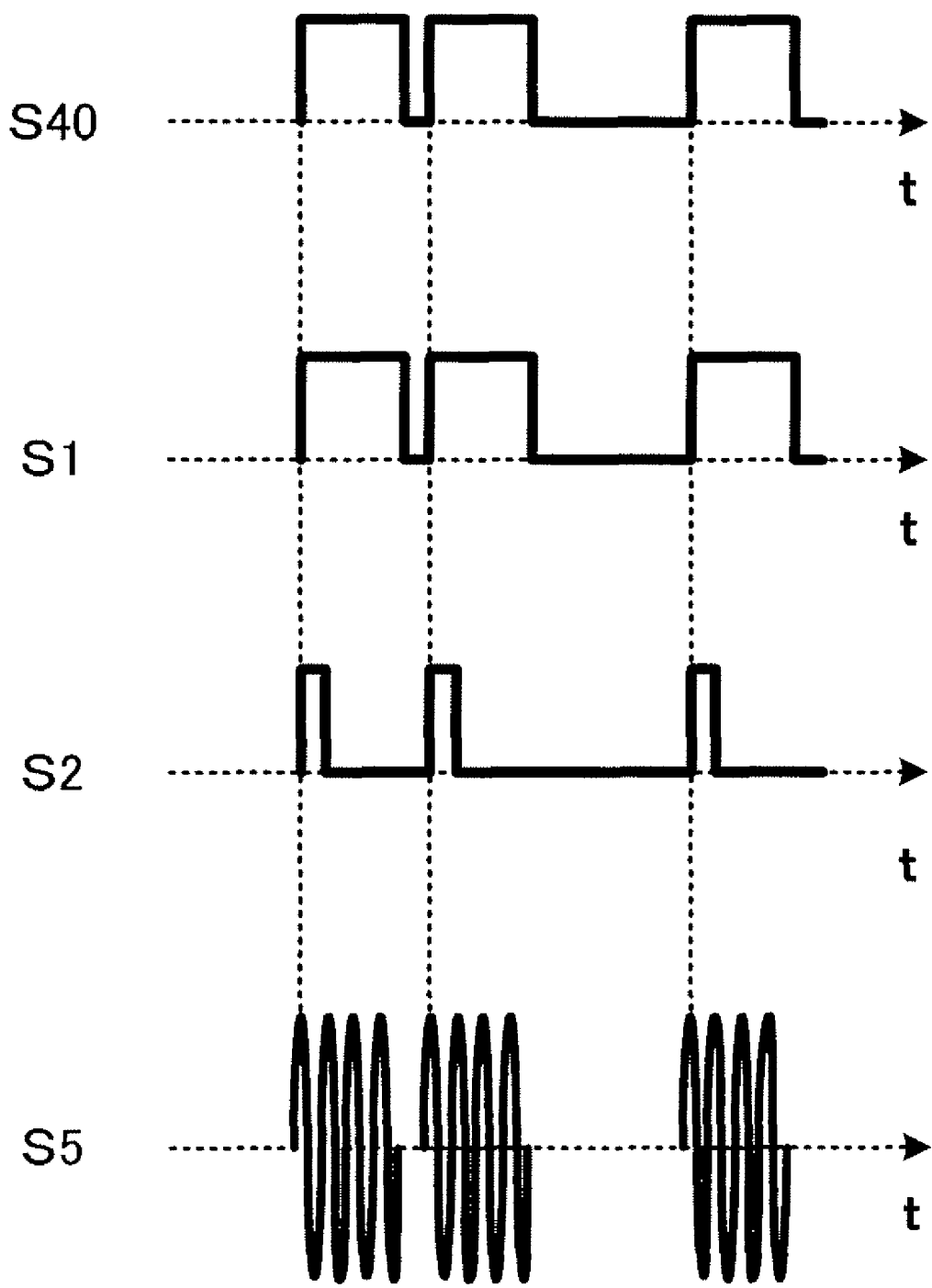
FIG. 25 is a timing chart showing the nature of signal variation in the modulator in FIG. 24.

FIG. 25 shows the nature of variation of each signal in modulator 2000. In FIG. 25, the vertical axes all represent voltage, and the horizontal axes all represent time.

The operation of modulator 2000 will now be described using FIG. 24 and FIG. 25.

First, transmit signal S40 is input to control signal generation circuits 2003 and 2004. In FIG. 25, a case in which transmit signal S40 is an RZ code is shown, but an NRZ code may also be used. In this case, pulse width control can be performed by installing a modulation circuit.

Control signal generation circuit 2003 generates transmit signal S40 whose pulse width, and rise and fall, have been modulated based on transmit signal S40, and outputs this signal. Details of this operation are common knowledge, and therefore a description thereof is omitted here. Meanwhile, control signal generation circuit 2004 generates control signal S2 based on transmit signal S40, and outputs this signal. Details of the generation of control signal S2 have been given in Embodiment 1, and will therefore be omitted here.

Control signals S1 and S2 are input to timing adjustment circuit 103, then input to waveform combining circuit 104, and input to active circuit 106 via impedance adjustment circuit 105, and cause active circuit 106 to operate intermittently. Operations from input to timing adjustment circuit 103 up to input to active circuit 106 have been described with reference to FIG. 6A in Embodiment 1, and therefore a description thereof is omitted here.

Output signal (short-pulse signal) S5 output from active circuit 106 of modulator 2000 is a modulated signal in which a high amplitude level is indicated by symbol 1, and a low amplitude level is indicated by symbol 0, as shown in FIG. 25.

As described above, according to this embodiment, by using an intermittent operation circuit of Embodiment 1 as a modulator, and changing control signals S1 and S2 according to the voltage value of transmit signal S40, a short-pulse signal S5 with a rapid rise and fall can be obtained, and a modulator 2000 can be implemented that enables the amplitude and frequency of ringing oscillation to be controlled arbitrarily according to the voltage value of transmit signal S40. The frequency and amplitude value of stable oscillation are determined by active circuit 106 circuit constants, and are invariant even if a control signal is changed.

Figure 26:
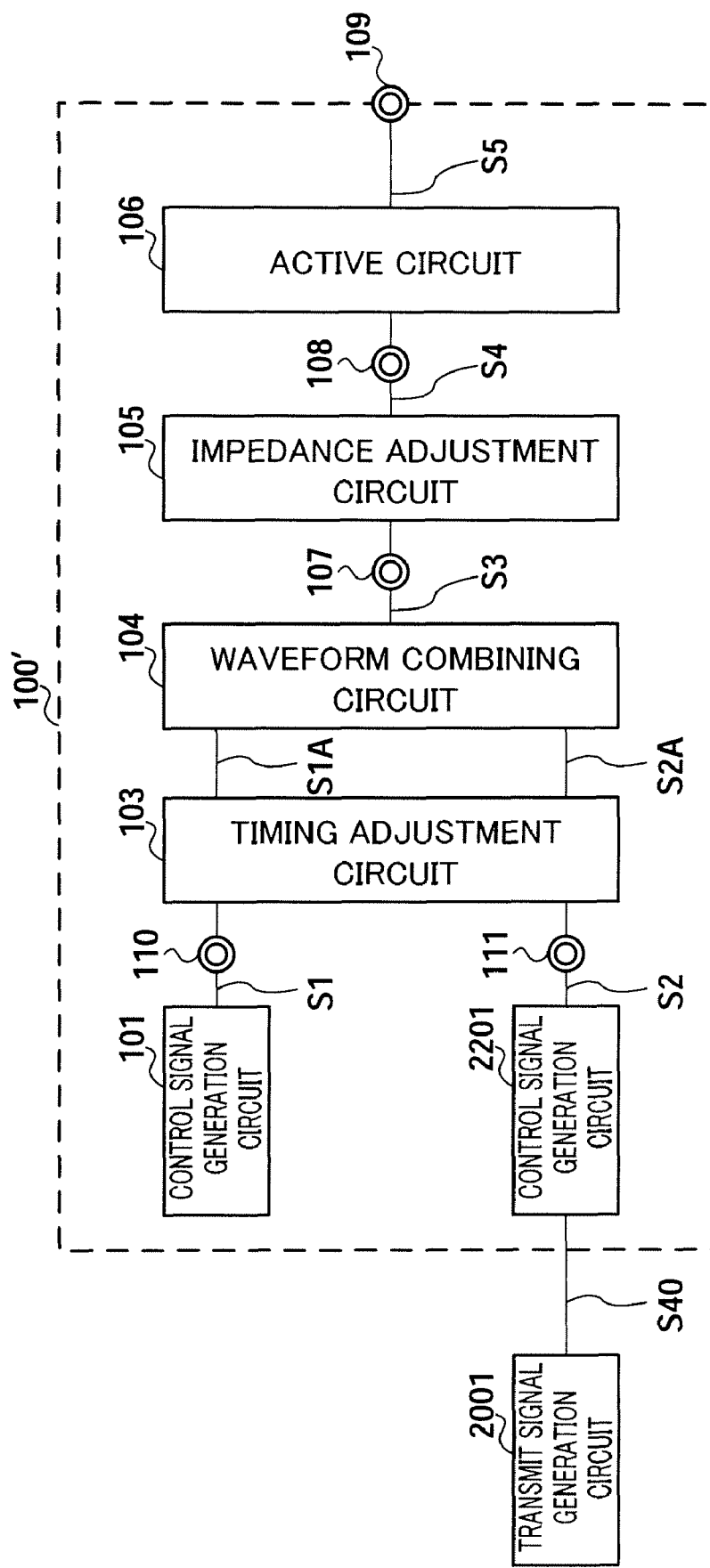
FIG. 26 is a block diagram showing another sample configuration of a modulator according to Embodiment 2.

FIG. 26 shows another sample configuration of a modulator. Modulator 2200 is designed so as to enable the frequency and voltage value of ringing to be controlled arbitrarily according to transmit signal S40. The configuration of modulator 2200 differs from the configuration in FIG. 24 in that there is no branching circuit 2002, control signal generation circuit 2003 is replaced by control signal generation circuit 101 and control signal generation circuit 2004 by a control signal generation circuit 2201, and transmit signal S40 is input only to control signal generation circuit 2201.

Figure 27:
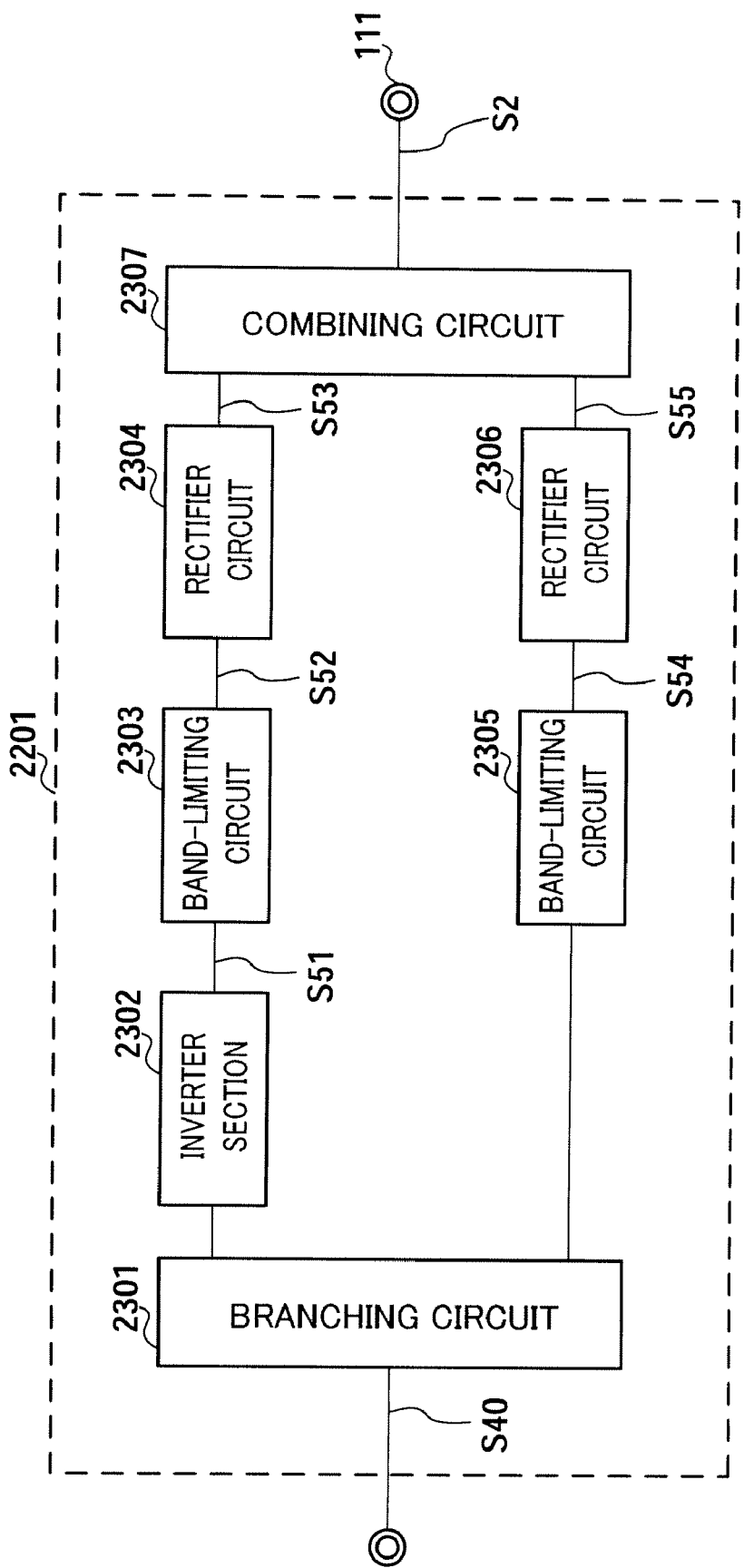
FIG. 27 is a block diagram showing a sample configuration of the control signal generation circuit in FIG. 26.

FIG. 27 shows a sample configuration of control signal generation circuit 2201 used in modulator 2200. Control signal generation circuit 2201 has a branching circuit 2301, an inverter section 2302, band-limiting circuits 2303 and 2305, rectifier circuits 2304 and 2306, and a combining circuit 2307. Band-limiting circuit 2303 and band-limiting circuit 2305, and rectifier circuit 2304 and rectifier circuit 2306, respectively, may have absolutely identical configurations, but may also be circuits having respectively desirable control signal rise and fall gradients through modification of parameters within each circuit without the circuit configuration being changed.

Figure 28:
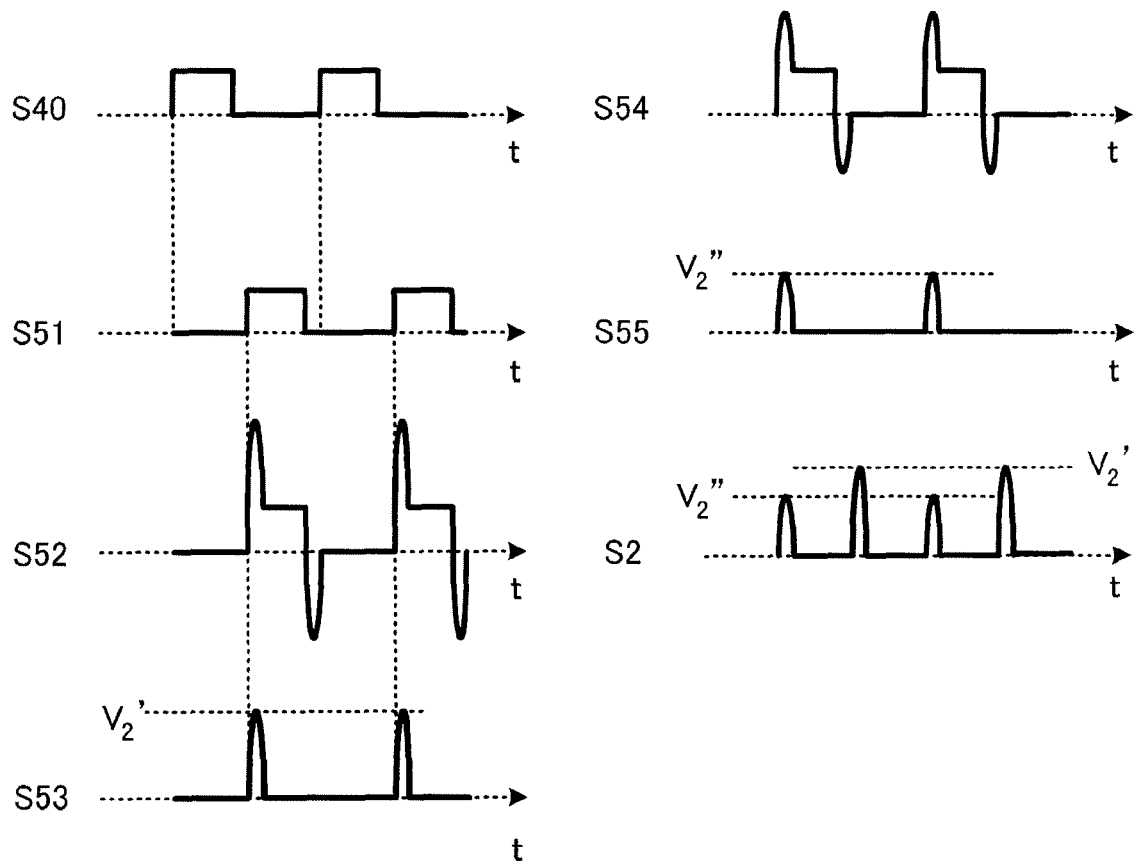
FIG. 28 is a timing chart showing the nature of signal variation until a control signal is generated in the control signal generation circuit in FIG. 27.

FIG. 28 is a timing chart shows the nature of signal variation until control signal S2 is generated in control signal generation circuit 2201 shown in FIG. 27. In FIG. 28, the vertical axes all represent voltage, and the horizontal axes all represent time.

The operation of control signal generation circuit 2201 will now be described using FIG. 27 and FIG. 28. A binary transmit signal S40 output from transmit signal generation circuit 2001 is made to branch into two control signals by branching circuit 2301. In FIG. 28, a case in which transmit signal S40 is an RZ code is shown, but an NRZ code may also be used. In this case, pulse width control can be performed by installing a modulation circuit. One transmit signal S40 resulting from branching by branching circuit 2301 is input to inverter section 2302, and an inverted signal S51 is output from inverter section 2302. Here, inverter section 2302 has a function of correcting the pulse width of transmit signal S40 by up to one apparatus period, and after reversing the sign, restoring the pulse width to a value equal to that of transmit signal S40. Inverted signal S51 is made signal S52, in which overshoot occurs in the rise and fall, by band-limiting circuit 2303. Signal S52 becomes a signal S53 with a waveform as shown in FIG. 28 by means of rectifier circuit 2304, a limiting circuit using a diode or the like. Here, the frequency and voltage value $V_2'$ of rectified signal S53 are determined by band-limiting circuit 2303 circuit constants.

The other transmit signal S40 resulting from branching by branching circuit 2301 is input to band-limiting circuit 2305, and becomes a signal S54, in which overshoot occurs in the rise and fall, by means of band-limiting circuit 2305. Signal S54 becomes a signal S55 with a waveform as shown in FIG. 28 by means of rectifier circuit 2306, a limiting circuit using a diode or the like. Here, the frequency and voltage value $V_2''$ of rectified signal S55 are determined by band-limiting circuit 2305 circuit constants.

Signals S53 and S55 resulting from band limiting are input to combining circuit 2307, and a signal resulting from combining by combining circuit 2307 is output as control signal S2.

Here, the rise and fall of transmit signal S40 are assumed to be sufficiently steep, but if the rise and fall are gradual, a driver circuit can be inserted in a stage prior to inverter section 2302 and band-limiting circuit 2305.

Figure 29:
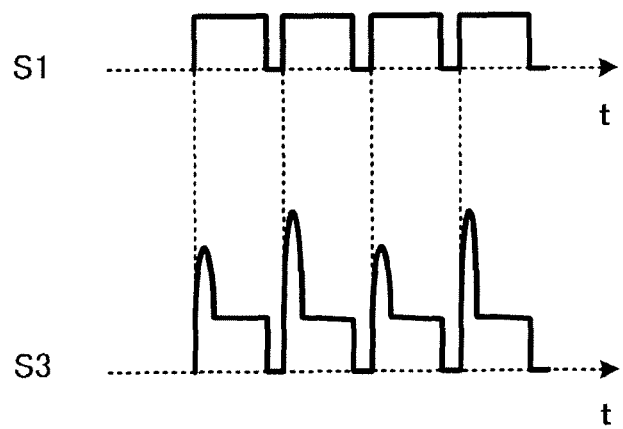
FIG. 29 is a waveform diagram explaining control signals.

When the configuration of the modulator is as shown in FIG. 26, and the configuration of control signal generation circuit 2201 is as shown in FIG. 27, control signal S1 output from control signal generation circuit 101 and combined control signal S3 output from waveform combining circuit 104 are as shown in FIG. 29. In FIG. 29, a case is shown in which delay time τ1 illustrated in FIG. 6A is 0, but this is not a limitation.

In the above description, a case in which the configuration of control signal generation circuit 2201 employs a band-limiting circuit in the same way as in FIG. 11 has been described as an example, but the configuration of control signal generation circuit 2201 is not limited to this, and control signal generation circuit 2201 can be implemented in a similar way using a configuration such as shown in FIG. 7 or FIG. 9.

As shown above, by inputting a control signal that changes according to the voltage value of transmit signal S40 output from transmit signal generation circuit 2001 to an oscillator, the frequency and amplitude value of ringing oscillation can be controlled according to the voltage value of transmit signal S40. The frequency and amplitude value of stable oscillation are determined by circuit constants of the active circuit, and are invariant even if a control signal is changed.

Figure 30:
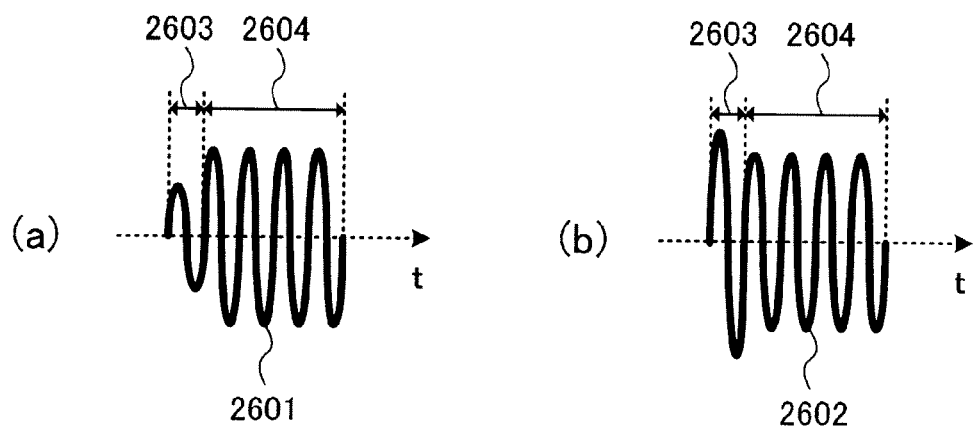
FIG. 30 is a waveform diagram showing modulated signals with different ringing oscillation amplitude values.
Figure 31:
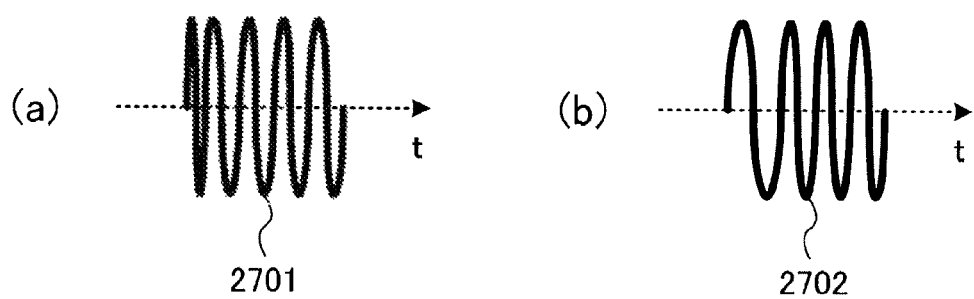
FIG. 31 is a waveform diagram showing modulated signals with different ringing oscillation frequencies.
Figure 32:
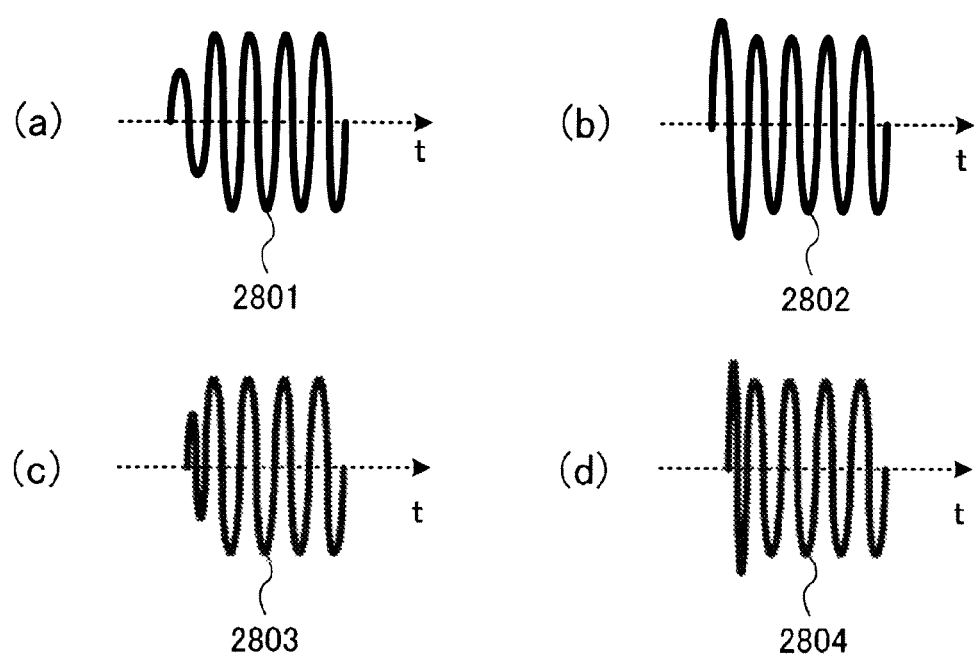
FIG. 32 is a waveform diagram showing modulated signals in which frequency and amplitude are different in ringing oscillation and stable oscillation.

FIG. 30 through FIG. 32 show the waveform of an output signal of a modulator of this embodiment—that is, a modulated signal (short-pulse signal S5). In these figures, the vertical axes all represent voltage, and the horizontal axes all represent time.

If circuit constants of active circuit 106 are decided so that an output signal S5 can be obtained in which the frequency of ringing oscillation and the frequency of stable oscillation are the same and the amplitude values differ, the amplitude value of ringing oscillation can be controlled arbitrarily according to the voltage value of transmit signal S40. As a result, information can be placed on a modulated signal 2601 and modulated signal 2602 for which the ringing oscillation voltage values are different, as shown in FIGS. 30 (*a*) and (*b*).

Period 2603 in FIG. 30 in which ringing oscillation is predominant is called the first period of a modulated signal, and period 2604 in which stable oscillation is predominant is called the second period of a modulated signal.

In the above description, a case has been described in which the frequencies of ringing oscillation and stable oscillation are the same and the amplitudes differ, but, information can also be placed on a modulated signal 2701 and modulated signal 2702 of different frequencies if the ringing oscillation and stable oscillation amplitudes are made the same, and the frequencies are made to differ, as shown in FIGS. 31 (*a*) and (*b*).

Similarly, information can also be placed on modulated signals 2801 through 2804 if the ringing oscillation and stable oscillation amplitudes, or the ringing oscillation and stable oscillation frequencies, are made to differ, as shown in FIG. 32 (*a*) through (*d*)

Embodiment 3

Figure 33:
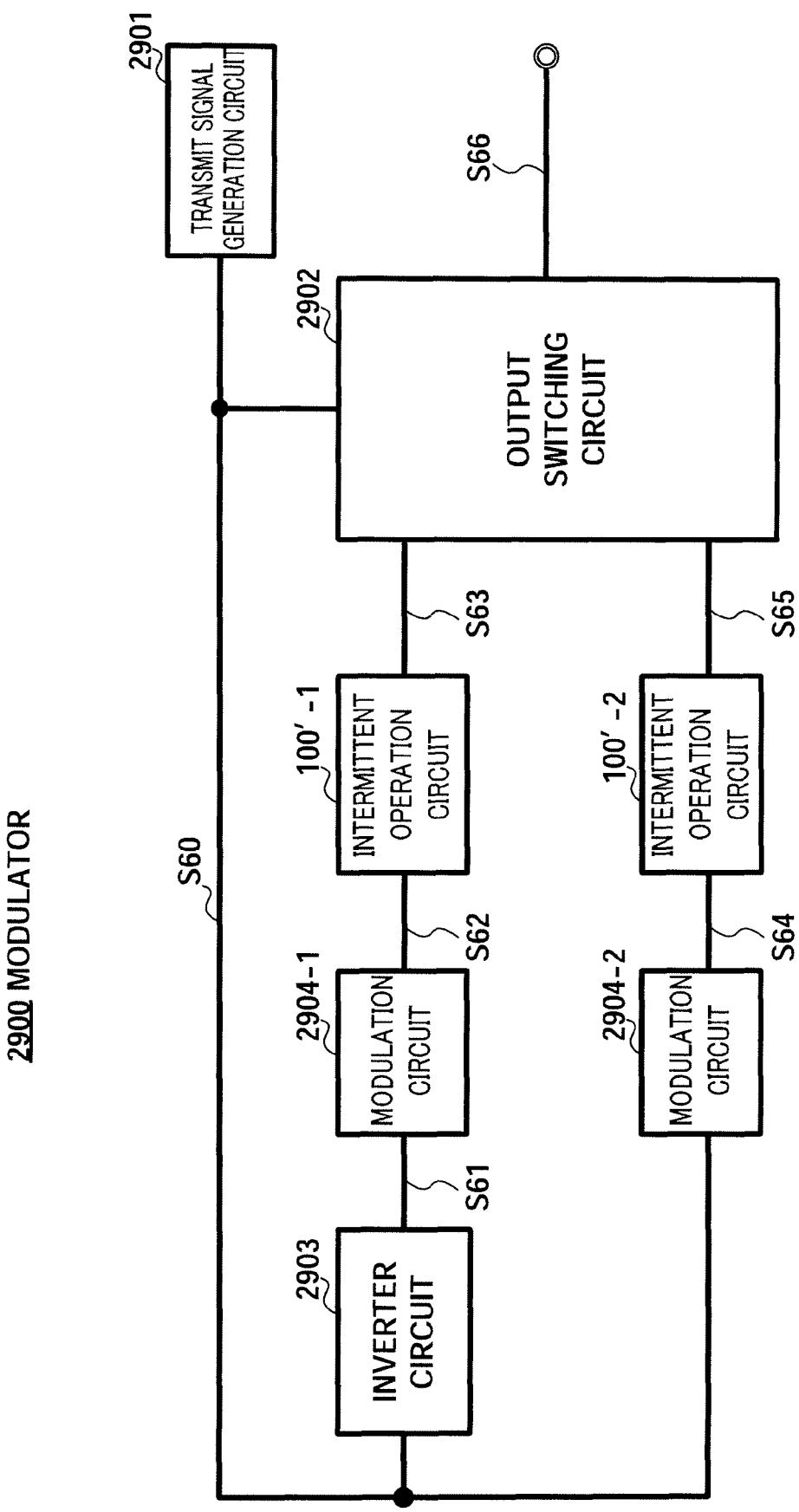
FIG. 33 is a block diagram showing a configuration of a modulator of Embodiment 3.

FIG. 33 is a block diagram showing the configuration of a modulator of this embodiment. Modulator 2900 has a transmit signal generation circuit 2901, intermittent operation circuits 100'-1 and 100'-2 each configured in the same way as intermittent operation circuit 100', an output switching circuit 2902, an inverter circuit 2903, and modulation circuits 2904-1 and 2904-2.

While ringing and stable oscillation frequencies and amplitude values are both the same in intermittent operation circuit 100' output, in the case of intermittent operation circuit 100'-1 and intermittent operation circuit 100'-2 different circuit constants are set so that the amplitude values are the same but the frequencies differ.

In intermittent operation circuits 100'-1 and 100'-2, in the same way as shown in FIG. 24, output signals S62 and S64 from modulation circuits 2904-1 and 2904-2 (output signals from branching circuit 2002 in FIG. 24) are input to two control signal generation circuits.

Figure 34:
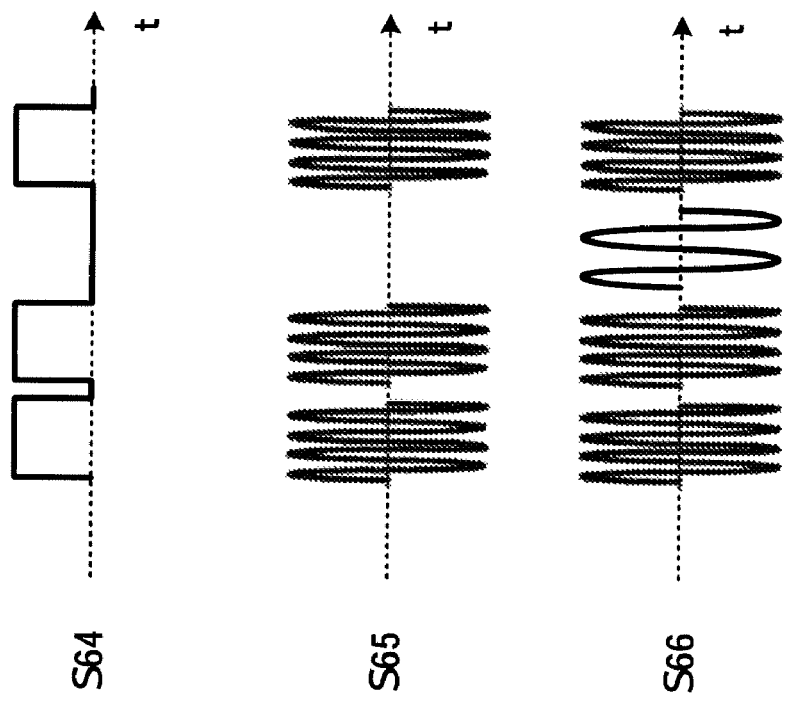
FIG. 34 is a timing chart showing the nature of signal variation in the modulator in FIG. 33.
Figure 34:
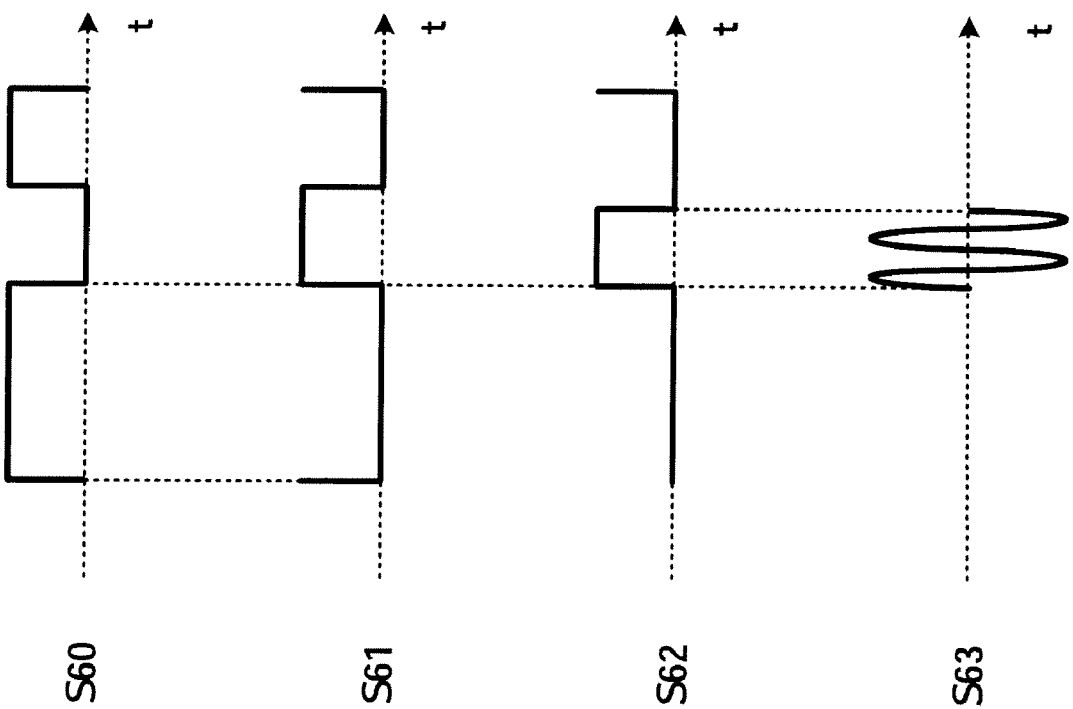

FIG. 34 shows the nature of variation of each signal in modulator 2900. In FIG. 34, the vertical axes all represent voltage, and the horizontal axes all represent time.

The operation of modulator 2900 will now be described using FIG. 33 and FIG. 34.

A transmit signal S60 output from transmit signal generation circuit 2901 is input to inverter circuit 2903, and is made an inverted signal S61 by inverter circuit 2903. Inverted signal S61 has its pulse width adjusted by modulation circuit 2904-1, and an intermittent operation circuit 100'-1 input signal S62 is thereby obtained. Intermittent operation circuit 100'-1 obtains an output signal (short-pulse signal) S63 by performing the same kind of operation as in above-described Embodiment 1.

Meanwhile, transmit signal S60 has its pulse width adjusted by modulation circuit 2904-2, and an intermittent operation circuit 100'-2 input signal S64 is thereby obtained. Intermittent operation circuit 100'-2 obtains an output signal (short-pulse signal) S65 by performing the same kind of operation as in above-described Embodiment 1.

Output signal (short-pulse signal) S63 and output signal (short-pulse signal) S65 are input to output switching circuit 2902, and transmit signal S60 has also been input to output switching circuit 2902. Output switching circuit 2902 selects signal S63 when a transmit signal S60 symbol is 0 and selects signal S65 when a transmit signal S60 symbol is 1, and outputs the selected signal as a modulated signal S66.

As described above, according to this embodiment, by providing a plurality of intermittent operation circuits 100'-1 and 100'-2 having different circuit constants and to each of which a transmit signal comprising transmit data is input, and an output switching circuit 2902 that switches its output signal between input signals S63 and S65 based on transmit signal S60 comprising transmit data, a modulator 2900 can be implemented that enables a short-pulse (modulated signal S66) having a fast output waveform rise time and fall time to be obtained, and that makes it possible to change the frequency thereof arbitrarily according to transmit signal S60.

In this embodiment, a case has been described in which, while intermittent operation circuit 100' output has the same frequency and amplitude value for both ringing and stable oscillation, with intermittent operation circuit 100'-1 and intermittent operation circuit 100'-2 different circuit constants are set so that the amplitude values are the same but the frequencies are different, but the present invention is not limited to this case.

Figure 35:
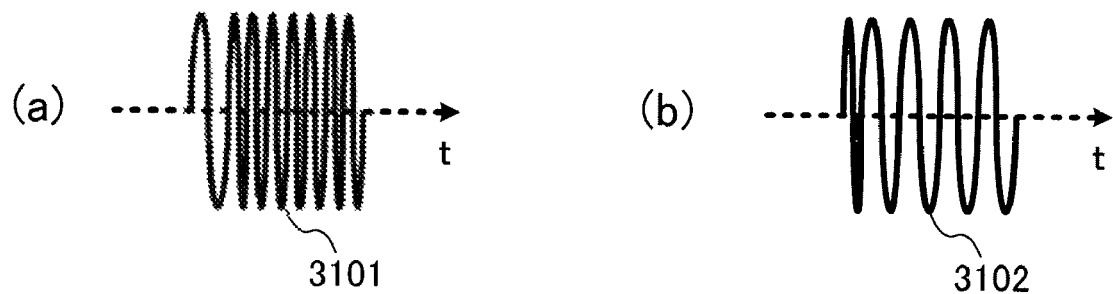
FIG. 35 is a waveform diagram showing examples of modulated signal waveforms formed by a modulator.

For example, as shown in FIG. 35, it is possible to decide respective circuit constants so that the frequencies of modulated signal 3101 ringing oscillation and modulated signal 3102 stable oscillation are the same, and the frequencies of modulated signal 3101 stable oscillation and modulated signal 3102 ringing oscillation are the same, and to obtain a modulated signal by changing the nature of frequency variation according to the voltage value of transmit signal S60. It is also possible to change at least one of the ringing oscillation and stable oscillation of output signal S63 from intermittent operation circuit 100'-1 and the ringing oscillation and stable oscillation of output signal S65 from intermittent operation circuit 100'-2, and output each as a modulated signal.

Figure 36:
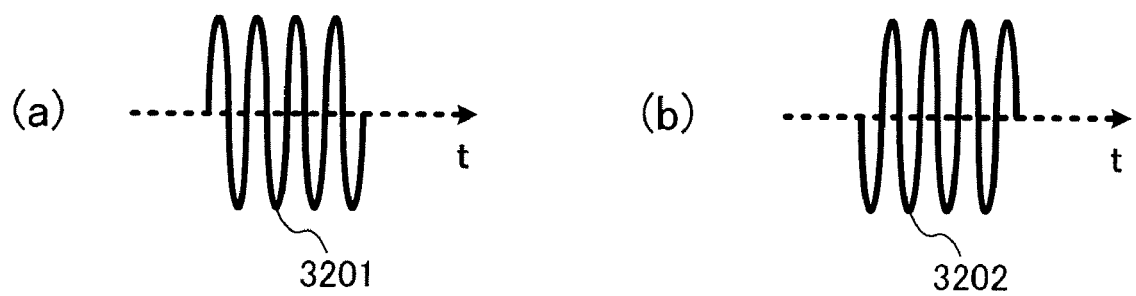
FIG. 36 is a waveform diagram showing examples of modulated signal waveforms formed by a modulator.

Also, by inverting the phase of output signal S63 from intermittent operation circuit 100'-1 and output signal S65 from intermittent operation circuit 100'-2, a modulated signal 3201 and modulated signal 3202 can be formed whose phase is inverted according to the voltage value of transmit signal S60 as shown in FIGS. 36 (a) and (b), and information can be placed on each. The waveform of control signal S2 output from control signal generation circuit 2201 for generating modulated signal 3201 and the waveform of control signal S2 output from the second control signal generation circuit for generating modulated signal 3202 should be of the same magnitude, or a close value, and have different positive/negative signs, as described in Embodiment 1.

Figure 37:
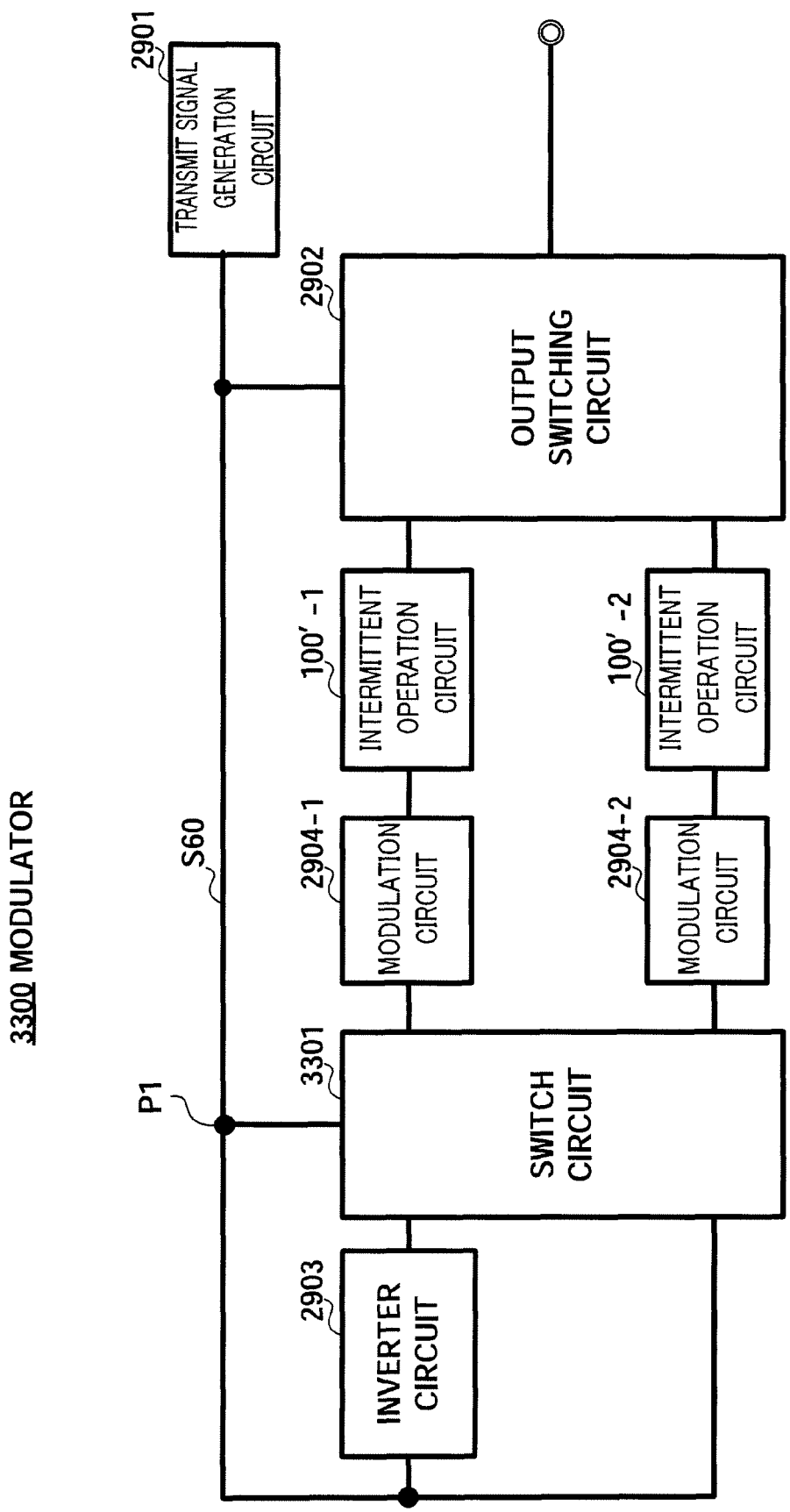
FIG. 37 is a block diagram showing another sample configuration of a modulator according to Embodiment 3.

FIG. 37, in which parts corresponding to those in FIG. 33 are assigned the same reference codes as in FIG. 33, shows another sample configuration of a modulator. This configuration differs from the configuration in FIG. 33 in having a switch circuit 3301 that switches between two input terminals and two output terminals according to transmit signal S60 in a stage prior to modulation circuits 2904-1 and 2904-2.

Intermittent operation circuits 100'-1 and 100'-2 are configured so that the signals from modulation circuits 2904-1 and 2904-2 are input only to second control signal generation circuit 2201 (see FIG. 26) as in the modulator configuration shown in FIG. 26. By means of this configuration, modulated signals can be output such that the amplitudes of at least one of the ringing oscillation and stable oscillation of the output signal from intermittent operation circuit 100'-1 and the ringing oscillation and stable oscillation of the output signal from intermittent operation circuit 100'-2 differ, the frequencies of the ringing oscillation of the output signal from intermittent operation circuit 100'-1 and the stable oscillation of the output signal from intermittent operation circuit 100'-2 are the same, and the frequencies of the stable oscillation of the output signal from intermittent operation circuit 100'-1 and the ringing oscillation of the output signal from intermittent operation circuit 100'-2 are the same.

Figure 38:
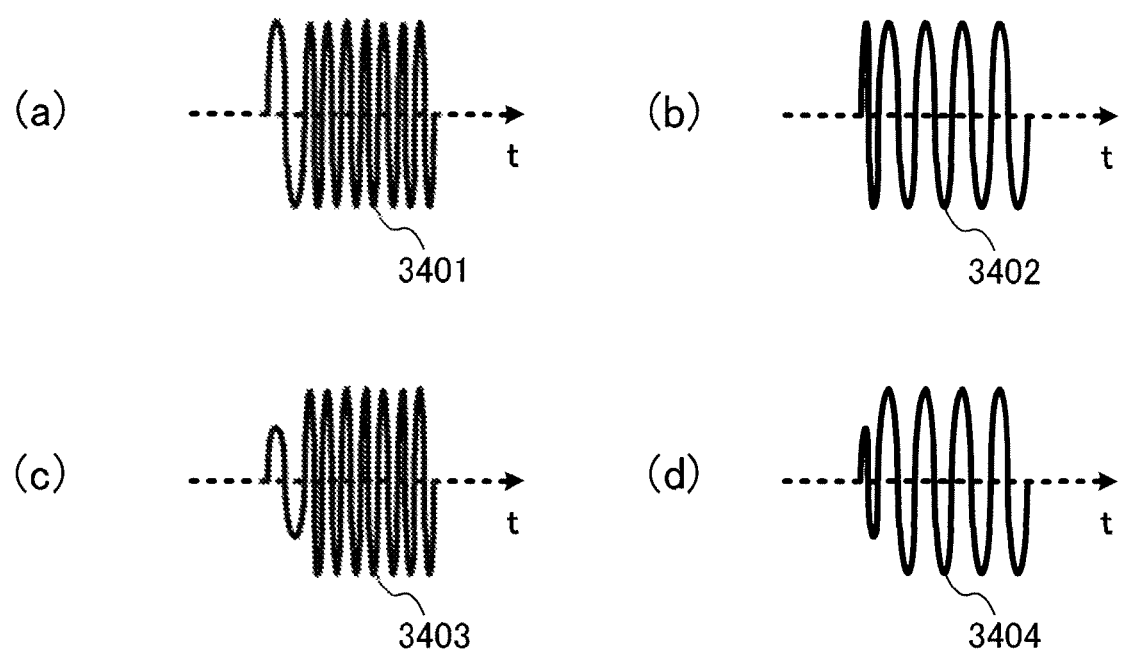
FIG. 38 is a waveform diagram explaining modulated signals formed by the modulator in FIG. 37.

In this way, modulator 3300 becomes a modulator supporting multivalued operation by switching of a binary signal that is an intermittent operation circuit 100'-1 output signal and a binary signal that is an intermittent operation circuit 100'-2 output signal, for a total 4-valued signal, by means of output switching circuit 2902. FIG. 38 (a) through (d) are waveform diagrams of modulated signals 3401 through 3404 output from modulator 3300 in FIG. 37. In FIG. 38, the vertical axes all represent voltage, and the horizontal axes all represent time.

In this embodiment, a case has been described in which two intermittent operation circuits 100'-1 and 100'-2 are used for binary transmit signal S60, but if three or more intermittent operation circuits with mutually different circuit constants are provided, and three or more output switching circuit 2902 input terminals are provided, a plurality of modulated signals can be obtained according to the transmit signal voltage.

If, in FIG. 37, a PN (Pseudo Noise) code generator is provided between connecting point P1 and switch circuit 3301, and the circuit constants of intermittent operation circuits 100'-1 and 100'-2 are set so that the amplitude values of the output signals from the two intermittent operation circuits 100'-1 and 100'-2 are the same and the frequencies of the ringing oscillation and stable oscillation in the respective output signals are the same, a modulator can be implemented that performs frequency hopping according to transmit signal S60. By this means, data errors due to frequency selective fading or the like can be decreased.

As described above, according to an intermittent operation circuit of the present invention, an intermittent operation circuit and modulator that enable an output waveform having a rapid rise and fall to be obtained with a small circuit scale and low power consumption can be implemented by generating ringing oscillation having a frequency that is the same as the operating frequency of the intermittent operation circuit, or a close value, by means of a control signal provided separately from a control signal that controls intermittent operation and a passive circuit (impedance adjustment circuit), and adjusting the timing at which the control signal is input so that ringing oscillation and stable oscillation are output continuatively. In particular, in the case of an intermittent operation circuit that uses an oscillator, an effect of oscillation startup being boosted by ringing oscillation can be further obtained. At this time, a contribution to active element inter-terminal capacitance and circuit floating capacitance charges can also be made by a high-voltage-value control signal for generating ringing oscillation.

Also, according to a modulator of the present invention, a modulated signal can be obtained in which the frequency, amplitude, and/or phase of ringing oscillation and stable oscillation are changed arbitrarily, and furthermore multivalued operation can be implemented by placing information in the frequency, amplitude, and/or phase of ringing oscillation and stable oscillation of a modulated signal.

While embodiments of the present invention have been described above with reference to the accompanying drawings, actual configurations are not limited to these embodiments, and various design variations and modifications may be possible without departing from the scope of the present invention.

While the present invention has been described above using the accompanying drawings, the present invention can also be implemented as a semiconductor integrated circuit or system that performs the same kind of operations.

The present application is based on Japanese Patent Application No. 2005-240641 filed on Aug. 23, 2005, and Japanese Patent Application No. 2006-226283 filed on Aug. 23, 2006, the entire content of which is expressly incorporated herein by reference.

INDUSTRIAL APPLICABILITY

An intermittent operation circuit, modulator, and modulation method of the present invention have an effect of enabling an output waveform having a rapid rise and fall to be obtained with a small circuit scale and low power consumption, and are suitable for use as an intermittent operation circuit and modulator in high-speed radio communications.

The invention claimed is:

1. An intermittent operation circuit comprising:
an active circuit having an active element;
a first control signal generation circuit that generates a first control signal that controls operation starting and operation stopping of said active circuit;
a second control signal generation circuit that generates a second control signal that causes said active circuit to perform ringing oscillation and controls a value of frequency or amplitude of said ringing oscillation;
a timing adjustment circuit that adjusts input timing of said first and second control signals to said active circuit so that said ringing oscillation and oscillation generated by operation of said active circuit are outputted continuously from said active circuit; and
an impedance adjustment circuit provided between said timing adjustment circuit and said active circuit.

2. The intermittent operation circuit according to claim 1, wherein said frequency of said ringing oscillation is made to have a same value as, or a value close to the same value as, an operating frequency of said active circuit.

3. The intermittent operation circuit according to claim 1, wherein said second control signal generation circuit generates, as said second control signal, a signal on which a frequency component having a same value as, or a value close to the same value as, an operating frequency of said active circuit is superimposed.

4. The intermittent operation circuit according to claim 1, wherein said second control signal generation circuit comprises:
a signal generation source;
a gate circuit that receives, as an input, a signal generated by said signal generation source, and outputs another signal having a rise time shorter than a rise time of said signal; and
a transition time conversion circuit that receives, as an input, the other signal outputted from said gate circuit, performs transition time conversion on said other signal, and outputs a resulting signal as said second control signal.

5. The intermittent operation circuit according to claim 1, wherein said second control signal generation circuit comprises:
a signal generation source;
a band-limiting circuit that receives, as an input, a signal generated by said signal generation source, and outputs an overshoot signal in which an overshoot has occurred; and
a rectifier circuit that rectifies said overshoot signal outputted from said band-limiting circuit.

6. A modulator comprising:
an intermittent operation circuit comprising:
an active circuit having an active element,
a first control signal generation circuit that generates a first control signal that controls operation starting and operation stopping of said active circuit,
a second control signal generation circuit that generates a second control signal that causes said active circuit to perform ringing oscillation and control a value of frequency or amplitude of said ringing oscillation, and
a timing adjustment circuit that adjusts input timing of said first and second control signals to said active circuit so that said ringing oscillation and oscillation generated by operation of said active circuit are outputted continuously from said active circuit; and
a transmit signal supply section that inputs a transmit signal that is transmit data, to said first and second control signal generation circuits of said intermittent operation circuit,
wherein said intermittent operation circuit changes at least one of an absolute value of a voltage value of said first control signal, an absolute value of a voltage value of said second control signal, and a gradient of a rise of said second control signal, based on said transmit signal, and outputs a modulated signal resulting from modulation of said transmit signal.

7. A modulator comprising:
a plurality of intermittent operation circuits that have different circuit constants and which each receive a transmit signal that is transmit data, each of said plurality of intermittent operation circuits comprising:

an active circuit having an active element, a first control signal generation circuit that generates a first control signal that controls operation starting and operation stopping of said active circuit, a second control signal generation circuit that generates a second control signal that causes said active circuit to perform ringing oscillation and control a value of frequency or amplitude of said ringing oscillation, and a timing adjustment circuit that adjusts input timing of said first and second control signals to said active circuit so that said ringing oscillation and oscillation generated by operation of said active circuit are outputted continuously from said active circuit; and an output switching circuit that receives, as an input, signals outputted from said plurality of intermittent operation circuits, and switches which signal is to be outputted from among said received signals, based on said transmit signal.

8. The modulator according to claim 7, further comprising an inverter circuit that is provided at a stage prior to intermittent operation of one of said plurality of intermittent operation circuits.

9. The modulator according to claim 7, further comprising a switch circuit that is provided at a stage prior to said plurality of intermittent operation circuits, and selectively inputs said transmit signal to one of said plurality of intermittent operation circuits according to said transmit signal.

10. The modulator according to claim 7, wherein:

a modulated signal is composed of two or more periods; and a frequency of one period of said modulated signal is modulated according to a gradient of a rise of said second control signal.

11. The modulator according to claim 7, wherein:

a modulated signal is composed of two or more periods; and an amplitude of one period of said modulated signal is modulated according to a voltage value of said second control signal.

12. The modulator according to claim 7, wherein:

a modulated signal is composed of two or more periods; and a frequency or amplitude of one period of said modulated signal is modulated according to a circuit constant of said active circuit.

13. The modulator according to claim 7, wherein a phase of a modulated signal is modulated according to whether a voltage value of said second control signal is positive or negative.

* * * * *